US00RE41738E

(19) United States
(12) Reissued Patent
Brenner et al.

(10) Patent Number: US RE41,738 E
(45) Date of Reissued Patent: Sep. 21, 2010

(54) RED LIGHT LASER

(75) Inventors: Mary K. Brenner, Plymouth, MN (US); Klein L. Johnson, Orono, MN (US)

(73) Assignee: Mytek, LLC, Maple Grove, MN (US)

(21) Appl. No.: 12/290,773

(22) Filed: Nov. 3, 2008

Related U.S. Patent Documents

Reissue of:
(64) Patent No.: 7,359,421
Issued: Apr. 15, 2008
Appl. No.: 11/715,834
Filed: Mar. 7, 2007

U.S. Applications:
(60) Provisional application No. 60/780,267, filed on Mar. 7, 2006.

(51) Int. Cl.
*H01S 5/00* (2006.01)
*H01S 3/08* (2006.01)

(52) U.S. Cl. ..... 372/50.124; 372/92; 372/99
(58) Field of Classification Search ..... 372/50.124, 372/92, 99
See application file for complete search history.

(56) References Cited

U.S. PATENT DOCUMENTS 5,258,990 A 11/1993 Olbright et al.
5,351,256 A 9/1994 Schneider et al.
5,428,634 A * 6/1995 Bryan et al. ..... 372/45.01
5,491,710 A 2/1996 Lo
5,557,627 A * 9/1996 Schneider, Jr. et al.
5,726,462 A * 3/1998 Spahn et al.
6,057,560 A * 5/2000 Uchida
6,570,905 B1 * 5/2003 Ebeling
6,618,410 B1 * 9/2003 Fischer et al. ..... 372/45.01
6,810,065 B1 * 10/2004 Naone
6,931,042 B2 * 8/2005 Choquette et al. ..... 372/43.01
7,006,545 B2 * 2/2006 Yoshida et al. ..... 372/46.01
7,075,962 B2 7/2006 Ryou et al.
7,110,427 B2 * 9/2006 Johnson et al. ..... 372/43.01
2002/0101899 A1 * 8/2002 Yokouchi et al.
2002/0159061 A1 * 10/2002 Ottens et al. ..... 356/338
2004/0208216 A1 * 10/2004 Naone et al.
2005/0233486 A1 * 10/2005 Cox et al. ..... 438/27

* cited by examiner

*Primary Examiner*—Minsun Harvey
*Assistant Examiner*—Phillip Nguyen
(74) *Attorney, Agent, or Firm*—Kinney & Lange, P.A.

(57) ABSTRACT

A semiconductor material vertical cavity surface emitting laser for emitting narrow linewidth light comprising a compound semiconductor material substrate and pairs of semiconductor material layers in a first mirror structure on the substrate of a first conductivity type each differing from that other in at least one constituent concentration and each first mirror pair separated from that one remaining by a first mirror spacer layer with a graded constituent concentration. An active region on the first mirror structure has plural quantum well structures separated by at least one active region spacer layer and there is a second mirror structure on the active region similar to the first but of a second conductivity type. A pair of electrical interconnections is separated by said substrate, said first mirror structure, said active region and said second mirror structure.

74 Claims, 18 Drawing Sheets

| Layer | | Layer Name | Material | Mole Fraction | Target Thickness (um) | Type | Dopant | Target Concentration (cm-3) |
|---|---|---|---|---|---|---|---|---|
| 33 | | Cap | GaAs | | 12 | P | C | >1E19 |
| 32 | | | Al(x)GaAs | x=0.50 | 381.35 | P | C | 3E19 |
| 31 | | | Al(x)GaAs | x=0.50 | 28.87 | P | C | 2E18 - 3E19 |
| 30 | | | Al(x)GaAs | x=1 -> 0.5 | 20.41 | P | C | 2E18 |
| 29 | | | Al(x)GaAs | x=1 | 32.28 | P | C | 2e18 |
| 28 | | | Al(x)GaAs | x=0.5 -> 1 | 20.41 | P | C | 1E18 -> 2E18 |
| 27 | x21 | | Al(x)GaAs | x=0.5 | 28.87 | P | C | 1e18 |
| 26 | | | Al(x)GaAs | x=1 -> 0.5 | 20.41 | P | C | 2E18 -> 1E18 |
| 25 | | | Al(x)GaAs | x=1 | 32.28 | P | C | 1e18 |
| 24 | | | Al(x)GaAs | x=0.5 -> 1 | 20.41 | P | C | 5e17 -> 1e18 |
| 23 | x6 | | Al(x)GaAs | x=0.5 | 28.87 | P | C | 5e17 |
| 22 | | | Al(x)GaAs | x=1 -> 0.5 | 20.41 | P | C | 1E18 -> 5E17 |
| 21 | | | Al(x)GaAs | x=1 | 32.28 | P | C | 1E18 |
| 20 | | Spacer | Al(x)Ga(1-x)InP | x=0.7 | 75 | P | Zn | 1e18 |
| 19 | | Barrier | Al(x)Ga(1-x)InP | x=0.4 | 20 | undoped | | |
| 18 | | QW | Ga(y)In(1-y)P | x=0.46 | 7 | undoped | | |
| 17 | | Barrier | Al(x)Ga(1-x)InP | x=0.4 | 6 | undoped | | |
| 16 | | QW | Ga(y)In(1-y)P | x=0.46 | 7 | undoped | | |
| 15 | | Barrier | Al(x)Ga(1-x)InP | x=0.4 | 6 | undoped | | |
| 14 | | QW | Ga(y)In(1-y)P | x=0.46 | 7 | undoped | | |
| 13 | | Barrier | Al(x)Ga(1-x)InP | x=0.4 | 20 | undoped | | |
| 12 | | | Al(x)Ga(1-x)InP | x=0.7 | 15 | undoped | | |
| 11 | | Spacer | Al(x)Ga(1-x)InP | x=0.7 | 60 | N | Si | 5E17 |
| 10 | | | Al(x)GaAs | x=1 | 32.28 | N | Si | 5E17 |
| 9 | | | Al(x)GaAs | x=0.5 -> 1 | 20.41 | N | Si | 5E17 -> 1E18 |
| 8 | | Hi index | Al(x)GaAs | x=0.5 | 28.87 | N | Si | 5E17 |
| 7 | x6 | | Al(x)GaAs | x=1 -> 0.5 | 20.41 | N | Si | 1E18 -> 5E17 |
| 6 | | Lo index | Al(x)GaAs | x=1 | 32.28 | N | Si | 5E17 |
| 5 | | | Al(x)GaAs | x=0.5 -> 1 | 20.41 | N | Si | 2E18 |
| 4 | | Hi index | Al(x)GaAs | x=0.5 | 28.87 | N | Si | 2E18 |
| 3 | x48 | | Al(x)GaAs | x=1 -> 0.5 | 20.41 | N | Si | 2E18 |
| 2 | | Lo index | Al(x)GaAs | x=1 | 32.28 | N | Si | 2E18 |
| 1 | | | Al(x)GaAs | x=0.1 -> 1 | 19.25 | N | Si | 2E18 |
| 0 | | Substrate | GaAs | | | N | | |

| Layer | Layer Name | Material | Mole Fraction | Target Thickness (nm) | Type | Dopant | Target Concentration (cm-3) |
|---|---|---|---|---|---|---|---|
| 33 | Cap | GaAs | | 12 | P | C | >1E19 |
| 32 | | Al(x)GaAs | x=0.50 | 381.35 | P | C | 3E19 |
| 31 | | Al(x)GaAs | x=0.50 | 28.87 | P | C | 2E18 - 3E19 |
| 30 | | Al(x)GaAs | x=1 -> 0.5 | 20.41 | P | C | 2E18 |
| 29 | | Al(x)GaAs | x=1 | 32.28 | P | C | 2e18 |
| 28 | | Al(x)GaAs | x=0.5 -> 1 | 20.41 | P | C | 1E18 -> 2E18 |
| 27 | x21 | Al(x)GaAs | x=0.5 | 28.87 | P | C | 1e18 |
| 26 | | Al(x)GaAs | x=1 -> 0.5 | 20.41 | P | C | 2E18 -> 1E18 |
| 25 | | Al(x)GaAs | x=1 | 32.28 | P | C | 1e18 |
| 24 | | Al(x)GaAs | x=0.5 -> 1 | 20.41 | P | C | 5e17-> 1e18 |
| 23 | x6 | Al(x)GaAs | x=0.5 | 28.87 | P | C | 5e17 |
| 22 | | Al(x)GaAs | x=1 -> 0.5 | 20.41 | P | C | 1E18 -> 5E17 |
| 21 | | Al(x)GaAs | x=1 | 32.28 | P | C | 1E18 |
| 20 | Spacer | Al(x)Ga(1-x)InP | x=0.7 | 75 | P | Zn | 1e18 |
| 19 | Barrier | Al(x)Ga(1-x)InP | x=0.4 | 20 | undoped | | |
| 18 | QW | Ga(y)In(1-y)P | x=0.46 | 7 | undoped | | |
| 17 | Barrier | Al(x)Ga(1-x)InP | x=0.4 | 6 | undoped | | |
| 16 | QW | Ga(y)In(1-y)P | x=0.46 | 7 | undoped | | |
| 15 | Barrier | Al(x)Ga(1-x)InP | x=0.4 | 6 | undoped | | |
| 14 | QW | Ga(y)In(1-y)P | x=0.46 | 7 | undoped | | |
| 13 | Barrier | Al(x)Ga(1-x)InP | x=0.4 | 20 | undoped | | |
| 12 | | Al(x)Ga(1-x)InP | x=0.7 | 15 | undoped | | |
| 11 | Spacer | Al(x)Ga(1-x)InP | x=0.7 | 60 | N | Si | 5E17 |
| 10 | | Al(x)GaAs | x=1 | 32.28 | N | Si | 5E17 |
| 9 | | Al(x)GaAs | x=0.5 -> 1 | 20.41 | N | Si | 5E17 -> 1E18 |
| 8 | Hi index | Al(x)GaAs | x=0.5 | 28.87 | N | Si | 5E17 |
| 7 | x6 | Al(x)GaAs | x=1 -> 0.5 | 20.41 | N | Si | 1E18 -> 5E17 |
| 6 | Lo index | Al(x)GaAs | x=1 | 32.28 | N | Si | 5E17 |
| 5 | | Al(x)GaAs | x=0.5 -> 1 | 20.41 | N | Si | 2E18 |
| 4 | Hi index | Al(x)GaAs | x=0.5 | 28.87 | N | Si | 2E18 |
| 3 | x48 | Al(x)GaAs | x=1 -> 0.5 | 20.41 | N | Si | 2E18 |
| 2 | Lo index | Al(x)GaAs | x=1 | 32.28 | N | Si | 2E18 |
| 1 | | Al(x)GaAs | x=0.1 -> 1 | 19.25 | N | Si | 2E18 |
| 0 | Substrate | GaAs | | | N | | |

Fig. 3

| Layer | Layer Name | Material | Mole Fraction | Target Thickness (nm) | Type | Dopant | Target Concentration (cm-3) |
|---|---|---|---|---|---|---|---|
| 34 | Cap | GaAs | | 12 | P | C | >1E19 |
| 33 | | Al(x)GaAs | x=0.50 | 385.18 | P | C | 3E19 |
| 32 | | Al(x)GaAs | x=0.50 | 29.16 | P | C | 2E18 - 3E19 |
| 31 | | Al(x)GaAs | x=1 -> 0.5 | 20.61 | P | C | 2E18 |
| 30 | | Al(x)GaAs | x=1 | 32.56 | P | C | 2e18 |
| 29 | | Al(x)GaAs | x=0.5 -> 1 | 20.61 | P | C | 1E18 -> 2E18 |
| 28 | | Al(x)GaAs | x=0.5 | 29.16 | P | C | 1e18 |
| 27 | | Al(x)GaAs | x=1 -> 0.5 | 20.61 | P | C | 3E18 -> 1E18 |
| 26 | | Al(x)GaAs | x=1 | 32.56 | P | C | 1e18 |
| 25 | | Al(x)GaAs | x=0.5 -> 1 | 20.61 | P | C | 5e17 -> 1e18 |
| 24 | | Al(x)GaAs | x=0.5 | 29.16 | P | C | 5e17 |
| 23 | | Al(x)GaAs | x=1 -> 0.5 | 20.61 | P | C | 1E18 -> 5E17 |
| 22 | | Al(x)GaAs | x=1 | 32.56 | P | C | 1E18 |
| 21b | | Al(x)Ga(1-x)InP | x=0.7 | 20*** | P | Zn | 1e18 |
| 21a | Spacer | Al(x)Ga(1-x)InP | x=0.5->0.7 | 55 | P | Zn | 1e18 |
| 20 | | Al(x)Ga(1-x)InP | x=0.5 | 14 | undoped | | |
| 19 | Barrier | Al(x)Ga(1-x)InP | x=0.5* | 6 | undoped | | ~0.35% tensile |
| 18 | QW | Ga(x)In(1-x)P | x=0.46 | 7** | undoped | | 0.4% compressive |
| 17 | Barrier | Al(x)Ga(1-x)InP | x=0.5* | 6 | undoped | | ~0.35% tensile |
| 16 | QW | Ga(x)In(1-x)P | x=0.46 | 7** | undoped | | 0.4% compressive |
| 15 | Barrier | Al(x)Ga(1-x)InP | x=0.5* | 6 | undoped | | ~0.35% tensile |
| 14 | QW | Ga(x)In(1-x)P | x=0.46 | 7** | undoped | | 0.4% compressive |
| 13 | Barrier | Al(x)Ga(1-x)InP | x=0.5* | 6 | undoped | | ~0.35% tensile |
| 12 | | Al(x)Ga(1-x)InP | x=0.5 | 14 | undoped | | |
| 11b | | Al(x)Ga(1-x)InP | x=0.7->0.5 | 55 | N | Si | 5E17 |
| 11a | Spacer | Al(x)Ga(1-x)InP | x=0.7 | 20*** | N | Si | 5E17 |
| 10 | | Al(x)GaAs | x=1 | 32.56 | N | Si | 5E17 |
| 9 | | Al(x)GaAs | x=0.5 -> 1 | 20.61 | N | Si | 5E17 -> 1E18 |
| 8 | Hi index | Al(x)GaAs | x=0.5 | 29.16 | N | Si | 5E17 |
| 7 | | Al(x)GaAs | x=1 -> 0.5 | 20.61 | N | Si | 1E18 -> 5E17 |
| 6 | Lo index | Al(x)GaAs | x=1 | 32.56 | N | Si | 5E17 |
| 5 | | Al(x)GaAs | x=0.5 -> 1 | 20.61 | N | Si | 2E18 |
| 4 | Hi index | Al(x)GaAs | x=0.5 | 29.16 | N | Si | 2E18 |
| 3 | | Al(x)GaAs | x=1 -> 0.5 | 20.61 | N | Si | 2E18 |
| 2 | Lo index | Al(x)GaAs | x=1 | 32.56 | N | Si | 2E18 |
| 1 | | Al(x)GaAs | x=0.1 -> 1 | 19.25 | N | Si | 2E18 |
| 0 | Substrate | GaAs | | | N | | |

Fig. 6

RED LIGHT LASER

Matter enclosed in heavy brackets [ ] appears in the original patent but forms no part of this reissue specification; matter printed in italics indicates the additions made by reissue.

CROSS-REFERENCE TO RELATED APPLICATION

This application claims the benefit of Provisional Patent Application No. 60/780,267 filed Mar. 7, 2006 for "RED LIGHT LASER".

BACKGROUND OF THE INVENTION

The present invention relates to Vertical Cavity Surface Emitting Laser (VCSEL) chips and subassemblies.

VCSELs are an important optical source for fiber optic data communication systems. Most of the devices that have been used in these systems emit light in the 830 to 860 nm wavelength range. However, VCSELs have been fabricated that have demonstrated emission at wavelengths equal to or in the vicinity of the following wavelength values: 660 nm, 780 nm, 850 nm, 980 nm, 1310 nm, and 1550 nm.

Red light emission VCSELs (~660 nm) are of considerable interest for applications in which the emission light capable of being seen by the human eye is valued. For instance, photoelectric sensors attuned to detecting such emission light might be used to sense the presence/absence, distance or other attribute of objects illuminated by that light. The ability of an observer to see the emitted beam for sensor alignment purposes is advantageous. A bar code scanner would be a special case of such a sensor, and users prefer the use light thereby of a visible wavelength so that they can more easily aim the light beam at the bar code. Chemical, biological, or medical sensors can take advantage of the absorption or scattering of light having a particular emitted wavelength or wavelength range. An example of this would be a pulse oximeter which relies on the relative absorption of 665 nm and 905 nm wavelength light sources to determine the oxygen content of blood being measured. Display or printing devices may rely on emitted light of such shorter wavelengths to provide higher resolution.

The intended use or uses for systems with such red light emission VCSELs in them determines the attributes thereof that are of interest including emitted light wavelength, power conversion efficiency, emission divergence angle and the emission mode structure. The mode structure describes the shape of the emitted beam. Some uses require a single mode device, i.e. a device with a uniform round Guassian shaped light emission intensity profile.

FIG. 1 is a fairly general schematic layer diagram of a typical thin-film semiconductor material red light emitting VCSEL structure formed on a substrate, 1. The mirrors, 2 and 3, forming the optical resonance cavity are constructed from AlGaAs materials having relatively large refractive index thin-film layers with a composition of approximately $Al_{0.5}Gs_{0.5}As$ alternating with relatively small refractive index thin-film layers with a composition of $Al_xGa_{1-x}As$ where the mole fraction x>0.85. Each such layer has a thickness corresponding to one quarter of an optical wavelength ($\lambda/4$) for the light intended to be emitted by the VCSEL in the material of interest for that layer. The optical thickness is defined by the wavelength divided by the refractive index. For instance, if the emission wavelength is 670 mn, and the composition is GaInP which has a refractive index of 3.65. The optical thickness corresponding to one wavelength in the material would then be (670 nm)/3.65=183.6 nm. Within the mirror, the layers are one quarter wavelength thick, and so the mirror layers would be in the range of 45 nm thick. Many periods (>20) of alternating quarter wavelength thick layers of these two materials forms a highly reflective mirror at the intended emission wavelength. Mirror 2 is doped to be of n-type conductivity, and mirror 3 is doped to be of p-type conductivity with a highly doped doping grading layer, 3', thereon having a thickness of $2n\lambda/4$ with n being an integer.

The active region, 4, of the VCSEL between mirrors 2 and 3 is formed from a AlGaInP materials system. One or more quantum wells are included in the structure formed of corresponding thin-films with a composition approximately equal to $Ga_{0.5}In_{0.5}P$. The injected carriers are captured by these quantum wells and then combine to thereby emit light. The composition and thickness of each quantum well thin-film together determines the emission, or photoluminescence, wavelength of the quantum wells. The quantum wells are spaced apart by barrier thin-film layers of AlGaInP, and together are bounded on either side in active region 4 by cladding, or confining, layers, 5 and 6, also of AlGaInP, with the compositions both barrier and cladding layers being chosen such that they are lattice constant matched to GaAs which will serve as the device substrate, and so that they have a bandgap that is larger than that of GaInP for thereby providing photon confinement. The total thickness of the active region is typically one wavelength ($1\lambda$) of the light intended to be emitted by the VCSEL thick although it can be any integer multiple of one half of the emission wavelength ($n\lambda/2$). A highly doped GaAs capping layer, 7, is provided on doping grading layer 3' to together reduce electrical resistance in lateral directions.

One of the constraints for the overall VCSEL epitaxial structure is that the lattice constant or parameter of the layers in the structure be nearly equal to that of the underlying GaAs substrate. If this is not true, then lattice defects can form which may cause damage to the device as the device is used and so limit the reliability or lifetime of the device. In the AlGaAs materials system, this condition is met for all possible compositions trading off aluminum for gallium ranging from AlAs to GaAs. However, in the AlGaInP materials system, this condition is met only for the compositions corresponding to $(Al_xGa_{1-x})_yIn_{1-y}P$, where the mole fraction y=0.51. The mole fraction x can be adjusted from 0 to 1.0 without affecting the lattice match to GaAs. However, the bandgap discontinuities in AlGaInP can be adjusted somewhat by adding small amounts of strain to the quantum wells and barrier layers by slightly adjusting the value of y and the thickness of the layers. If the total thickness of the strained layers is kept sufficiently thin (100-200 nm) then defects do not form, and the device reliability is not affected.

Confinement of electrical currents to desired locations in the structure can be provided with the standard techniques of ion implantation and oxide aperture formation as shown in the more general schematic layer diagram of FIG. 2 of the FIG. 1 VCSEL structure having the same semiconductor material layers. There, such structures as an implant or oxide confining layer, 8, and a top metal interconnection, 9, with an emission aperture are indicated. Substrate 1 has another metal interconnection, 1', provided on the exposed outer surface thereof. Other useable alternatives exist for this purpose which have been demonstrated in VCSELs emitting light at other wavelengths.

Red light emission VCSELs have been demonstrated, but, typically, the temperature range of operation is limited and the maximum output power, particularly single mode output power, is also limited. These limits become more significant for shorter wavelength devices. Due to the small bandgap discontinuities and the low thermal conductivities in AlGaInP—AlGaAs material systems, the output power of red light emission VCSELs decreases if the emission wavelength decreases or the operation temperature increases, or both. Small bandgap discontinuities means that carriers that should be captured in the quantum wells and recombined there to emit light, instead, escape and so don't contribute to the light output. As the temperature increases, the charge carriers are even more likely to escape those wells. For shorter wavelength devices, the quantum well needs to be shallower in order to generate the higher energy, or shorter wavelength, light but this also contributes to the escape of charge carriers. Thus, there is a very significant increase in difficulty between achieving high performance in a device emitting at 650 nm versus one emitting at 670 nm, for instance.

Another issue which plays a role in the temperature range of operation is the electrical resistance of the AlGaAs mirrors. The $Al_{0.5}Ga_{0.5}As$ composition, which constitutes approximately 50% of the mirror thickness, has poor thermal conductivity. In addition, the many periods in the mirror contributes to an increase in the resistance, which results in additional heating. The additional heating combined with the extra sensitivity of this material system to temperature only exacerbates the problem. These factors combine to make providing a red light emission VCSEL device with substantial single mode output power particularly difficult. Further, the smaller aperture size of the single mode device typically means that these devices heat more quickly. Thus, there is a desire to have a red light emission VCSEL device configured to be less bounded by such limitations.

BRIEF SUMMARY OF THE INVENTION

The present invention provides a semiconductor material vertical cavity surface emitting laser for emitting narrow linewidth light comprising a compound semiconductor material substrate and at least two first mirror pairs of semiconductor material layers in a first mirror structure on the substrate of a first conductivity type each differing from that other in at least one constituent concentration and each first mirror pair separated from that one remaining by a first mirror spacer layer with a graded constituent concentration. An active region on the first mirror structure has plural quantum well structures separated by at least one active region spacer layer and at least two second mirror pairs of semiconductor material layers in a second mirror structure on the active region of a second conductivity type each differing from that other in at least one constituent concentration and each pair separated from that one remaining by a second mirror spacer layer with a graded constituent concentration. A pair of electrical interconnections is separated by said substrate, said first mirror structure, said active region and said second mirror structure. The quantum well structures can be under stress in one direction with the active region spacer layer under stress in an opposite direction.

BRIEF DESCRIPTION OF THE DRAWINGS

FIG. 3 shows a table setting out an epitaxial layer structure of a red light emission VCSEL embodying the present invention, FIG. 6 shows another table setting out an epitaxial layer structure of an alternative red light emission VCSEL of the present invention.

DETAILED DESCRIPTION

Figure 1:
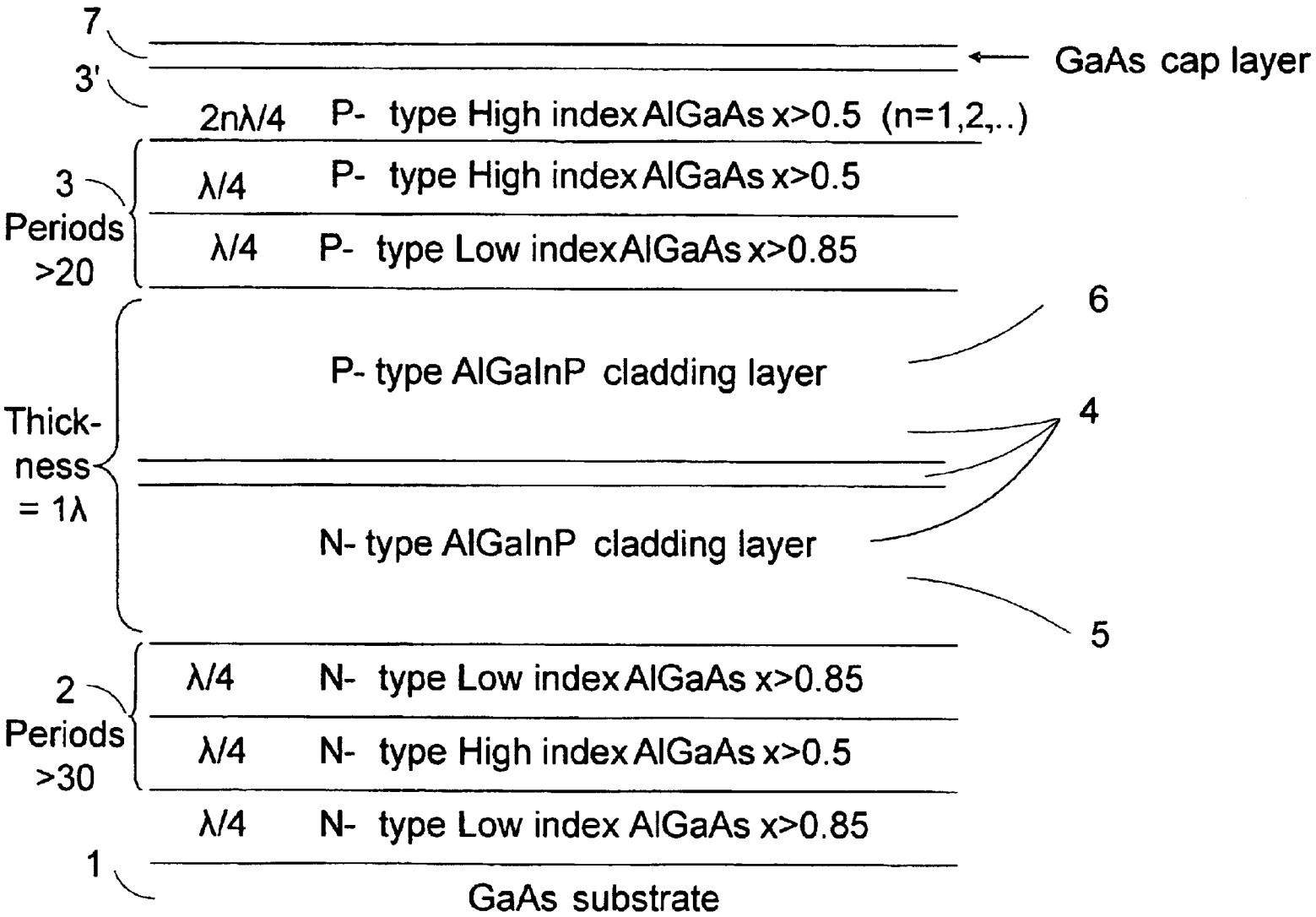
FIG. 1 shows a general schematic layer diagram for an epitaxial layer structure for a red light emission VCSEL.
Figure 2:
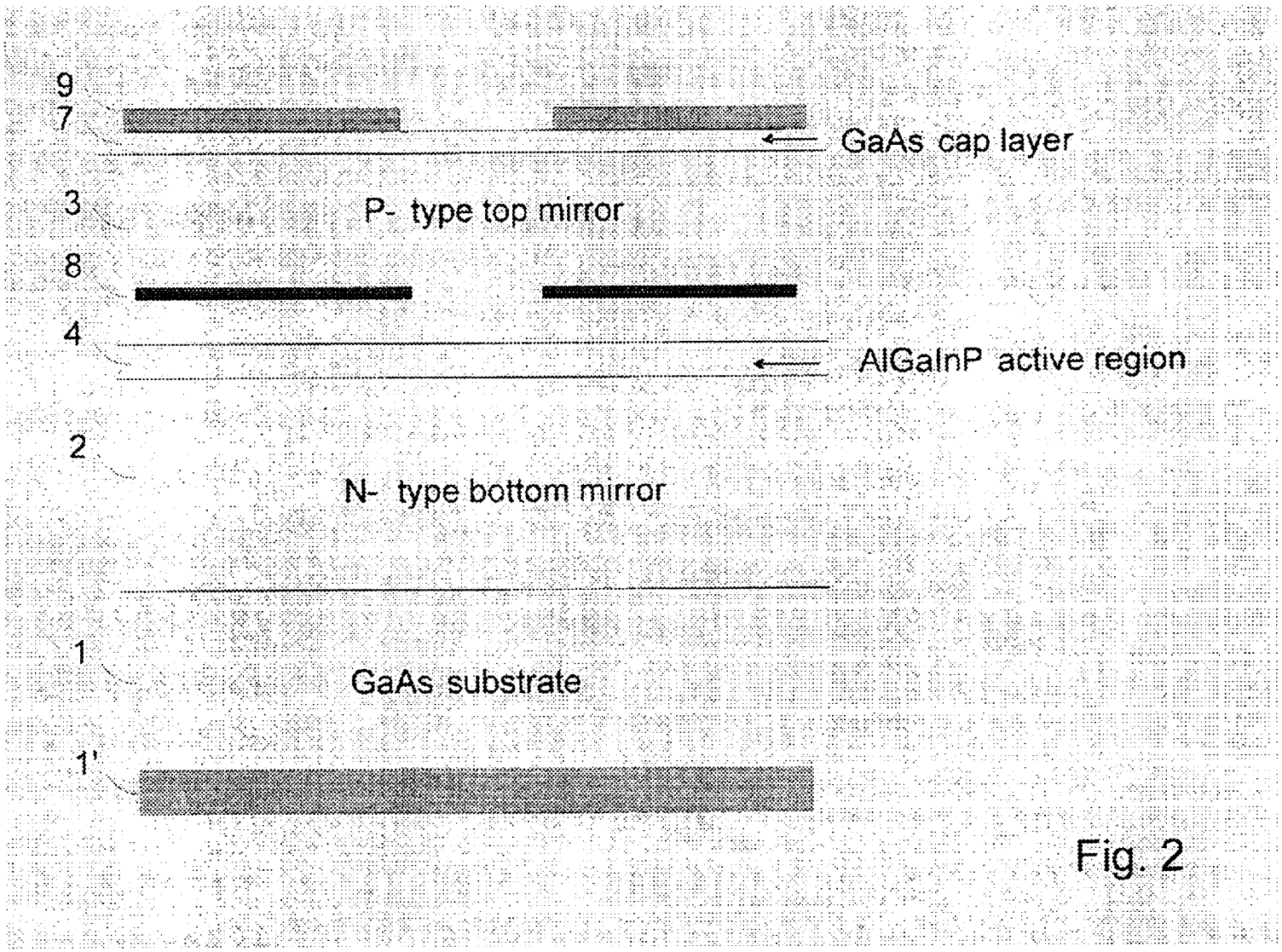
FIG. 2 shows a more general schematic layer diagram of a red light emission VCSEL structure adding electrical operation structures.

FIG. 3 is a tabular layer listing for a red light emitting VCSEL device indicating the thin-film semiconductor material epitaxial layers for that red VCSEL device, a device that relieves the foregoing limitations. Each of the 33 layers in the table for the VCSEL device structure is specified with respect to its composition, thickness, dopant type and dopant concentration.

The epitaxial structure is grown on a GaAs semiconductor material substrate that is doped n-type, and is labeled layer number 0 in the table. The substrate major surface on which the further layers are to be deposited should be misoriented from the (100) orientation by 6 to 10°. This choice provides an improvement in the optical quality of the AlGaInP layers of the active region where the emitted light is generated. However, a higher degree of misorientation results in a tendency for the high aluminum containing layers of the mirror to oxidize or otherwise degrade at an accelerated rate.

Device mirrors, 2'(layers 2 through 10) and 3'(layers 21 through 32), are made up of two kinds of primary layers alternating with each *other* in a device layer stack with each comprised of one of two differing compositions of $Al_xGa1_{1-x}$ As, that is, an AlAs layer free of gallium alternating with an $Al_{0.5}Ga_{0.5}As$ layer. These primary layers are spaced apart with layers in between in which the aluminum and gallium distributions are mole fraction graded monotonically over the layer thickness to match the gallium content in the primary layers on either side of the graded spacer layers. While it is desirable for the gallium content of the two primary layers to differ as much as possible in order to maximize the reflectivity to the light intended to be emitted, the minimum aluminum composition is limited to around a mole fraction value x=0.5 in order to eliminate absorption due to the band edge.

Mirror 2' closest to the substrate is doped to be of n-type conductivity with silicon. Numerous other n-type dopants could alternatively be used, including tellurium and selenium. Mirror 3' on the opposite side of a device active region, 4', has the same range of compositions and with similar monotonically graded spacer layers between the two primary layers, but is doped to be of p-type conductivity with carbon. Other p-type dopants could alternatively be used, such as zinc or magnesium. The total thickness of a mirror layers repeatability period is ½λ where λ is the desired wavelength within the range of 650 nm to 680 nm.

The details of the layer thicknesses and doping concentrations are chosen to minimize the electrical resistance of the device without having an unduly negative impact on the optical reflectivity of the mirror or on optical absorption. The thickness of the graded spacer layers is shown to be around 20 nm. The thicknesses of the other two layers are each approximately equal to the ¼λ minus the thickness of a graded spacer layer. The thickness of the graded spacer layer should be at least 10 nm thick to reduce the electrical resistance of the mirror without reducing the optical reflectivity thereof An optimum thickness is typically in the range of 20 to 25 nm.

The choice of doping concentration is also a matter of balancing the desire to reduce resistivity by increasing the doping concentration, without increasing the optical absorption due to free carrier absorption. In the six periods of n-type conductivity mirror 2' closest to active region 4', the doping is $5\cdot10^{17}/cm^3$ in the $Al_{0.5}Ga_{0.5}As$ layers and AlAs layers, and is graded over the layer thickness from $1\cdot10^{18}/cm^3$, at the side of the graded spacer layers closest to the adjacent AlAs layer, to $5\cdot10^{17}/cm^3$ at the side of the graded spacer layers closest to the adjacent $Al_{0.5}Ga_{0.5}As$ layers. In the remainder of the n-type conductivity mirror, the doping is uniform at a level of $2\cdot10^{18}/cm^3$.

Within p-type conductivity mirror 3', in the first six periods closest to the active region, the doping in the $Al_{0.5}Ga_{0.5}As$ layers is $5\cdot10^{17}/cm^3$, the doping in the AlAs layer is $1\cdot10^{18}/cm^3$, and is graded over the layer thickness from $5\cdot10^{17}/cm^3$, at the side of the graded spacer layers closest to the adjacent $Al_{0.5}Ga_{0.5}As$ layer, to $1\cdot10^{18}/cm^3$ at the side of the graded spacer layers closest to the adjacent AlAs layers. [Inmost] *In most* of the remainder of the p-type conductivity mirror, the doping is $1\cdot10^{18}/cm^3$ in the $Al_{0.5}Ga_{0.5}As$ layers, $2\cdot10^{18}/cm^3$ in the AlAs layers, and grades over the layer thickness from $1\cdot10^{18}/cm^3$, at the side of the graded spacer layers closest to the adjacent $Al_{0.5}Ga_{0.5}As$ layer, to $2\cdot10^{18}/cm^3$ at the side of the graded spacer layers closest to the adjacent AlAs layers.

The lower doping in the mirror periods closest to the active region in both p-type conductivity mirror 3' and n-type conductivity mirror 2' is chosen to reduce the free carrier absorption in the layers where the optical field is highest. The more distant mirror periods have a weaker effect on absorption of the optical beam, and hence a higher doping concentration can be tolerated to aid in reducing the electrical resistance.

At the outer surface of p-type conductivity mirror 3' in the device (outer surface of layer 30) there is provided a first $Al_{0.5}Ga_{0.5}As$ layer, in which the doping is graded from $2\cdot10^{18}/cm^3$ to $3\cdot10^{19}/cm^3$, to thereby grade to the doping of a further layer of $Al_{0.5}Ga_{0.5}As$ that is provided thereon doped to $3\cdot10^{19}/cm^3$. The outermost layer is GaAs and is doped at $>1\cdot10^{19}/cm^3$. These three layers together come to a thickness of approximately 9λ/4 thick where λ is the desired emission wavelength of the device. The purpose of doping these topmost layers of the structure at a very high concentration is to provide a very low lateral resistance in order to spread the device operating electrical current evenly across the aperture of the device.

In the case where an oxide aperture is used for current confinement, the compositions of the mirror are to be adjusted. Since the layer to be oxidized must contain a higher Al concentration than the other mirror layers, AlAs can no longer be used for the low index layer. Typically $Al_xGa_{1-x}As$ with x in the range from 0.85 to 0.95 would be used. However, if the oxide aperture is located in mirror 3' between the active layer and the metal interconnection with an aperture, then it is preferable to continue to use AlAs as the low index layer in the other mirror (mirror 2' closest to the substrate), in order to minimize the electrical resistivity and maximize the thermal conductivity of this latter mirror. On the other hand, 2 to 4 of the bottom mirror periods closest to the quantum well active region may also have a reduced aluminum content, in order to avoid accidental oxidization of these layers when the aperture is being oxidized.

Other doping concentrations are possible for use ranging from a low of $1\cdot10^{17}/cm^3$ in the six layer repeatability periods of mirrors 2' and 3' closest to the active region to a high of $3\cdot10^{18}/cm^3$ in the remaining portions of those mirrors. However, concentrations within approximately ±30% of the ones specified in FIG. 3 are typically optimum.

Figure 4A:
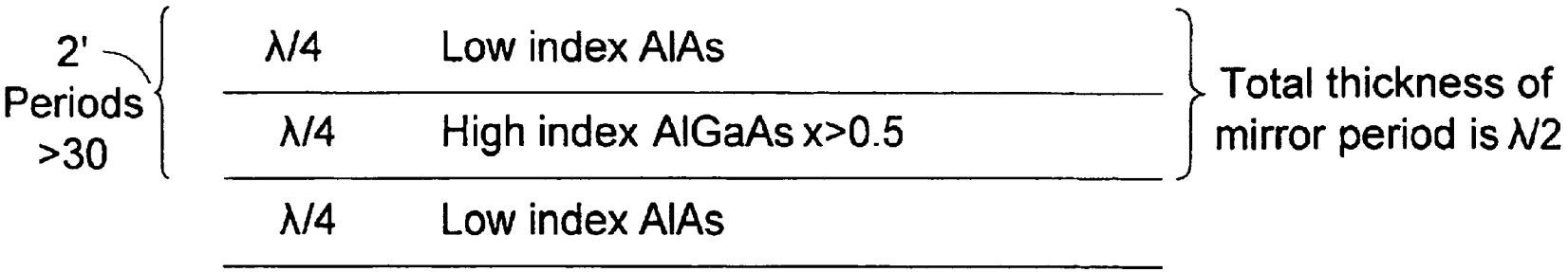
FIG. 4 shows a portions of schematic layer diagrams embodying part of the present invention.
Figure 4B:
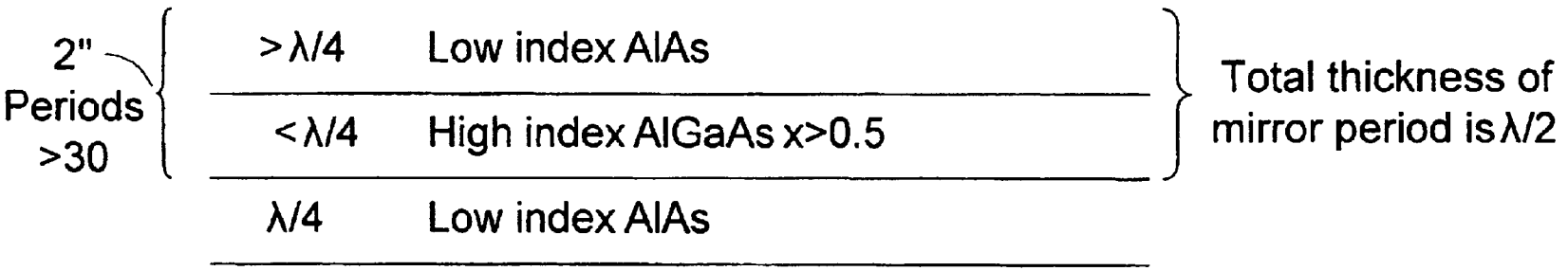

Other variations on mirror configurations can have benefits in reducing the electrical resistance of the device or improving the thermal conductivity, or both, one of which is shown in the example of FIG. 4. FIG. 4A shows the schematic representation of mirror 2' as configured in the table of FIG. 3 above, i.e. having a quarter wave thickness of AlAs, or the low index layer of the mirror, that is alternated with a quarter wave thick layer of AlGaAs, or the high index layer of the mirror. The alternative mirror, 2", is shown in FIG. 4B. While the total thickness of the mirror period remains at a half wavelength, the thickness of the AlAs layer is increased, while the thickness of the AlGaAs layer is decreased. Since the AlAs layer has both a higher mobility, and a higher thermal conductivity, the resistance of the mirror is reduced, and the thermal conductivity is increased. The optical thickness of the AlAs layers is 50% greater than the optical thickness of the $Al_{0.5}Ga_{0.5}As$ layers but any ratio greater than 1:1 will have a positive effect.

Figure 5:
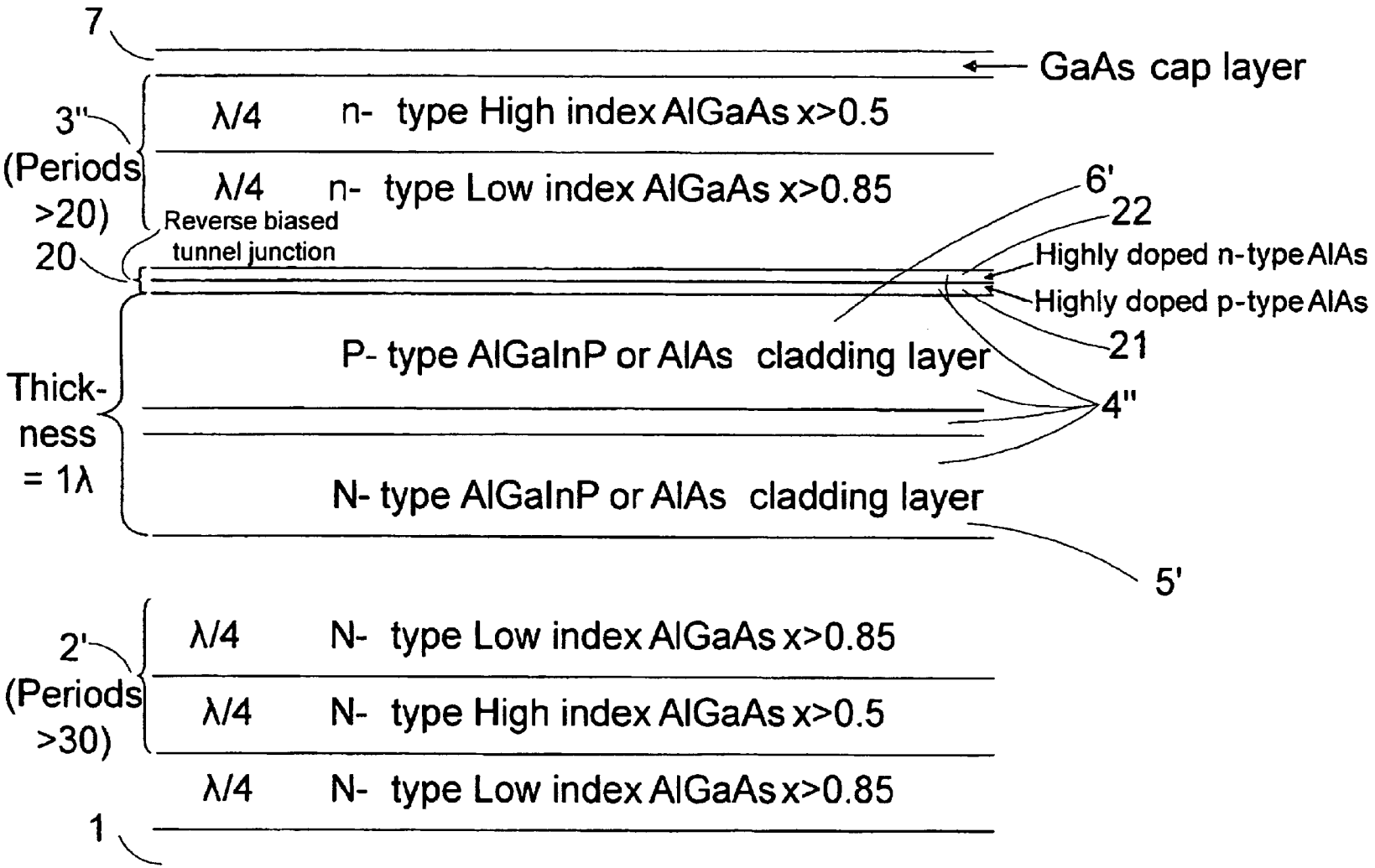
FIG. 5 shows a portion of schematic layer diagram embodying a part of the present invention.

Yet another variation for reducing the electrical resistance of the mirror structure is illustrated in FIG. 5. Since the mobility of n-type conductivity AlAs and AlGaAs is significantly higher than that of p-type material, the electrical resistivity of the device in the table of FIG. 3 above can be reduced by doping not only mirror 2' thereof to be of n-type conductivity but also doping mirror 3' thereof to be of n-type conductivity. Nevertheless, a pn junction is required for proper functioning of the device. This can be accomplished by incorporating a tunnel junction, 20, in an extended active region, 4j, of the device adjacent to that resulting n-type conductivity mirror, 3", between the tunnel junction extending active region 4' and capping layer 7. When the pn junction at quantum well active region 4' is forward biased, tunnel junction 20 will be reverse biased. By highly doping the layers forming tunnel junction 20, the breakdown voltage can be made very low, so that this junction does not add much to the required drive voltage of the device. The highly doped layers ($10^{19}/cm^3$) are kept very thin, and located at an optical null in order to minimize their excess contribution to the free carrier absorption loss. The tunnel junction comprises, sequentially grown, a highly doped $n^{++}$-conductivity type layer, 21, followed by a $p^{++}$-conductivity type layer, 22, each having a thickness of around 100 to 350 Å. The n-type conductivity layers have a doping concentration of approximately $2\cdot10^{19}/cm^3$ and the p-type conductivity layers have a doping concentration of approximately $8\cdot10^{19}/cm^3$.

In between the two mirrors 2' or 2" and 3' or 3" of the device of the table in FIG. 3 or the mirror variations in FIGS. 4 and 5 are the layers (11 through 20) of active region 4' as bounded on either side thereof by a corresponding one of a pair of cladding layers, 5'(layers 11 and 12) and 6'(layer 20), the region in which the injected charge carriers combine with one another and emit light. These layers are based upon the $(Al_xGa_{1-x})_yIn_{1-y}P$ material, which is lattice constant matched to GaAs at a value of approximately mole fraction y=0.51. Hereafter, y will be specified only when it differs from a value of 0.51.

Active region 4' begins from mirror 2' with a 60 nm thick ungraded spacer or cladding layer 5' of $Al_{0.7}Ga_{0.3}InP$, doped to have a n-type conductivity at a level of $5\cdot10^{17}/cm^3$, followed by a 15 nm thick layer of the same composition but undoped. The next layer is a 20 nm thick layer of undoped $Al_{0.4}Ga_{0.6}InP$. The light generating layers consist of the three $Ga_{0.46}In_{0.54}P$ quantum wells of approximately 7 nm thickness each [seperated] *separated* by two $Al_{0.4}Ga_{0.6}InP$ barrier layers with a thickness of 6 nm each, all undoped. This is followed by another 20 nm thick layer of an undoped $Al_{0.4}Ga_{0.6}InP$ composition. Active region 4' is then ended on the side thereof opposite from where it begins by $Al_{0.7}Ga_{0.3}InP$ ungraded spacer or cladding layer 6' with a thickness of 75 nm and doped p-type to a level of $1\cdot10^{18}/cm^3$ that is located next to the structure of p-type conductivity mirror 3'. The total thickness [of] *including* the AlGaInP layers is adjusted to be equivalent to the optical thickness of 1λ, where λ is again the desired emission wavelength of the VCSEL. The thicknesses of the $Ga_{0.46}In_{0.54}P$ quantum well layers in active region 4' are adjusted slightly to achieve the desired emission wavelength in the range of 640 to 670 nm depending upon the desired emission wavelength within that range.

Active region 4' of AlGaInP materials is chosen to provide the best carrier injection and carrier confinement in order to improve the wavelength and temperature range of operation, and to improve the output power. The quantum well composition of $Ga_{0.46}In_{0.54}P$ is chosen to provide a compressive strain of approximately 0.5%. This increases the well depth, and increases the bandgap discontinuity between the quantum wells and surrounding barrier layers, to reduce carrier leakage. The composition of the spacer, or cladding, layers 5' and 6' is also chosen to be near the maximum band edge offset to provide improved carrier confinement. Finally, the doping concentrations and locations are chosen to provide a balance between good carrier injection, without undue free carrier absorption. In particular, the use of a higher concentration of p-doping with zinc ($1\cdot10^{18}/cm^3$) provides an improved barrier to electron leakage into p-type conductivity mirror 3' which would cause increased optical absorption.

The wavelength at the peak of the photoluminescence emission from the quantum wells is chosen to be 5 nm to 15 nm shorter than the Fabry-Perot resonance cavity mirror separation, or cavity emission wavelength, to enhance the higher temperature performance of the devices. This increases the temperature range of operation since the peak of the quantum well emission moves to higher wavelengths with increasing temperature faster than the Fabry-Perot resonance wavelength, the emission wavelength of the VCSEL cavity increases with temperature. This means that the two are aligned at a temperature above room temperature and so improves the higher temperature performance. The offset between the cavity emission and the quantum well emission can be increased to achieve improved higher temperature performance, but this comes at the cost of an increased threshold current, and reduced output power at room temperature and below. The two considerations are balanced depending upon the performance requirements of a particular use selected for the device.

FIG. 6 provides a tabular layer listing for a red light emitting VCSEL device indicating the thin-film semiconductor material epitaxial layers for an alternative red VCSEL device having a semiconductor material thin-film epitaxial layer structure with 34 layers that allows the device to achieve a better performance at higher temperatures. The layers of mirrors 2'(layers 2 through 10) and 3'(layers 22 through 31) of this device are identical to those of the layer structure set out in FIG. 3 but an active region, 4", therefor (layers 11a through 21b) has AlGaInP layers that differ from those in the device of Table 3 as described below.

Active region 4" between mirrors 2' and 3' is still a total of 1λ thick, where λ is the desired optical emission wavelength. With the exception of the quantum wells and barrier layers, the In composition of all the layers is chosen to be lattice constant matched to GaAs, i.e. approximately $(Al_xGa_{1-x})_{0.51}In_{0.49}P$.

The first layer adjacent to n-type conductivity AlGaAs material based mirror 2' is a $(Al_{0.7}Ga_{0.3})InP$ spacer, or part of a cladding layer, 5", (layers 11a through 12) doped to have an n-type conductivity at $5\cdot10^{17}/cm^3$. Then, over a thickness of approximately 55 nm there is provided a graded spacer layer, with the composition mole fraction graded from x=0.7 to x=0.5. This layer is also doped to have n-type conductivity at $5\cdot10^{17}/cm^3$. This is followed by an undoped $Al_{0.5}Ga_{0.5}InP$ that is 14 nm thick.

Next are four barrier layers interleaved with three quantum well layers, all undoped. The quantum well layers are compressively strained with a composition of $Ga_{0.46}In_{0.54}P$. Unlike the structure of FIG. 3, here the barrier layers are arranged to be under tensile stress in order to compensate the compressive stress of the quantum well layers. These layers are $(Al_{0.5}Ga_{0.5})InP$ with the value of y adjusted to be greater than 0.51 to thereby provide a tensile stress of approximately 0.35% in these layers.

After the fourth tensile stressed barrier layer is a cladding layer, 6", beginning with lattice constant matched undoped $Al_{0.5}Ga_{0.5}InP$ layer with a thickness of 14 nm. A graded spacer then follows with its composition mole fraction graded from x=0.5 to x=0.7 over a thickness of 55 nm. This layer is doped $1\cdot10^{18}/cm^3$. The final $Al_{0.7}Ga_{0.3}InP$ spacer in cladding layer 6" is 20 mn thick and doped $1\cdot10^{18}/cm^3$.

Thus, active region 4" in this VCSEL has a balancing of the compressive stress of the quantum wells with the tensile stress of the interleaved barrier layers to provide even better carrier confinement. The tensile stress, in combination with the compressively strained quantum wells, provides an even greater improvement in the quantum well depth than is observed in a structure with lattice matched barrier layers and compressively strained quantum wells of the same composition. In addition, the balancing of the strain makes it possible to decrease y even more to create an even greater degree of compressive strain in the quantum wells without risking the generation of defects that would have a negative impact on device lifetime. In addition, the mole fraction graded x=0.5 to x=0.7 AlGaInP layers also provide better carrier confinement.

Figures 7A, 7B:
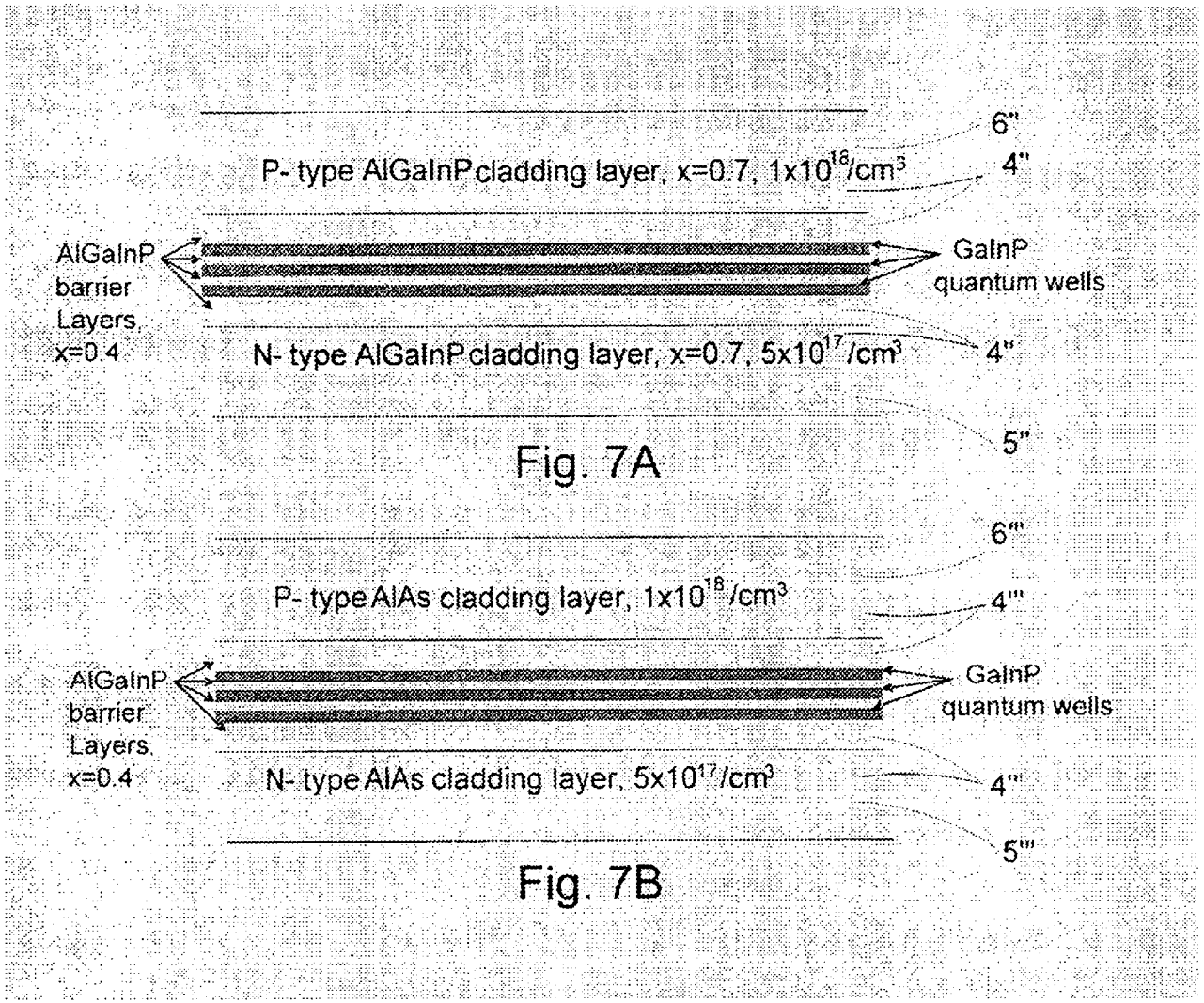
FIG. 7 shows a portions of schematic layer diagrams embodying part of the present invention.

Another variation of the active region configuration is shown in the active region representation diagrams of FIG. 7. FIG. 7A shows the arrangement of FIG. 6 with the use of $Al_{0.7}Ga_{0.3}InP$ cladding layers both for n-type conductivity cladding layer 5" and for p-type conductivity cladding layer 6" in active region 4". The variation involves the replacement of these $Al_{0.7}Ga_{0.3}InP$ cladding layers with AlAs layers of the same optical thickness (or an optical thickness that maintains the total cavity thickness at an integer multiple of $\lambda/2$) as shown in FIG. 7B. Thus, a n-type conductivity AlAs layer, 5'", in FIG. 7B replaces layer 5" of FIG. 7A and a [n] *p*-type conductivity AlAs layer, 6'", in FIG. 7B replaces layer 6" of FIG. 7A to form an active region, 4'". The AlAs layers still provide carrier confinement, but have a higher thermal conductivity, thus assisting in removal of heat. Thicker layers will be more effective in thermal management, but make control of the thickness of the cavity more challenging.

Figure 8:
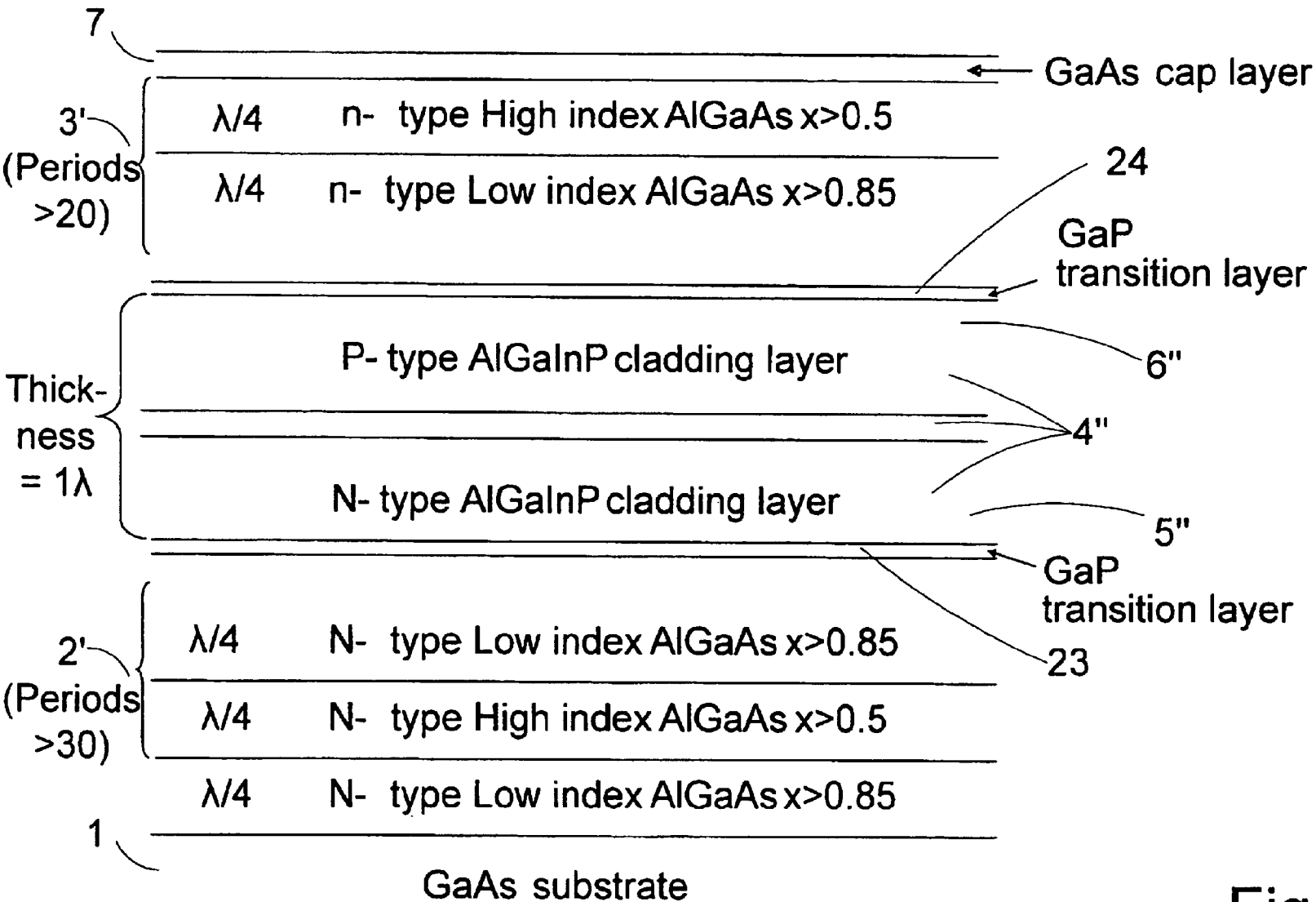
FIG. 8 shows a portion of schematic layer diagram embodying a part of the present invention.

FIG. 8 shows yet another variation at the active region. In this case a thin GaP transition layer, 23, is included at the interface between n-type conductivity AlGaInP cladding layer 5" and the first AlAs layers in mirror 2' and a thin GaP transition layer, 24, is included at the interface between the p-type conductivity AlGaInP cladding layer and the first AlAs layers in mirror 3'. A band discontinuity exists at the interface between the AlAs and the AlGaInP, contributing to the voltage drop across the device. The incorporation of a GaP transition layer that is very thin (<10 nm) provides an intermediate step in the band energy, thus reducing the discontinuity. However, the GaP transition layers are not lattice matched to the GaAs substrate, and so the thickness of these layers must be kept very thin to avoid generating defects that might degrade the lifetime of the device.

Figure 9:
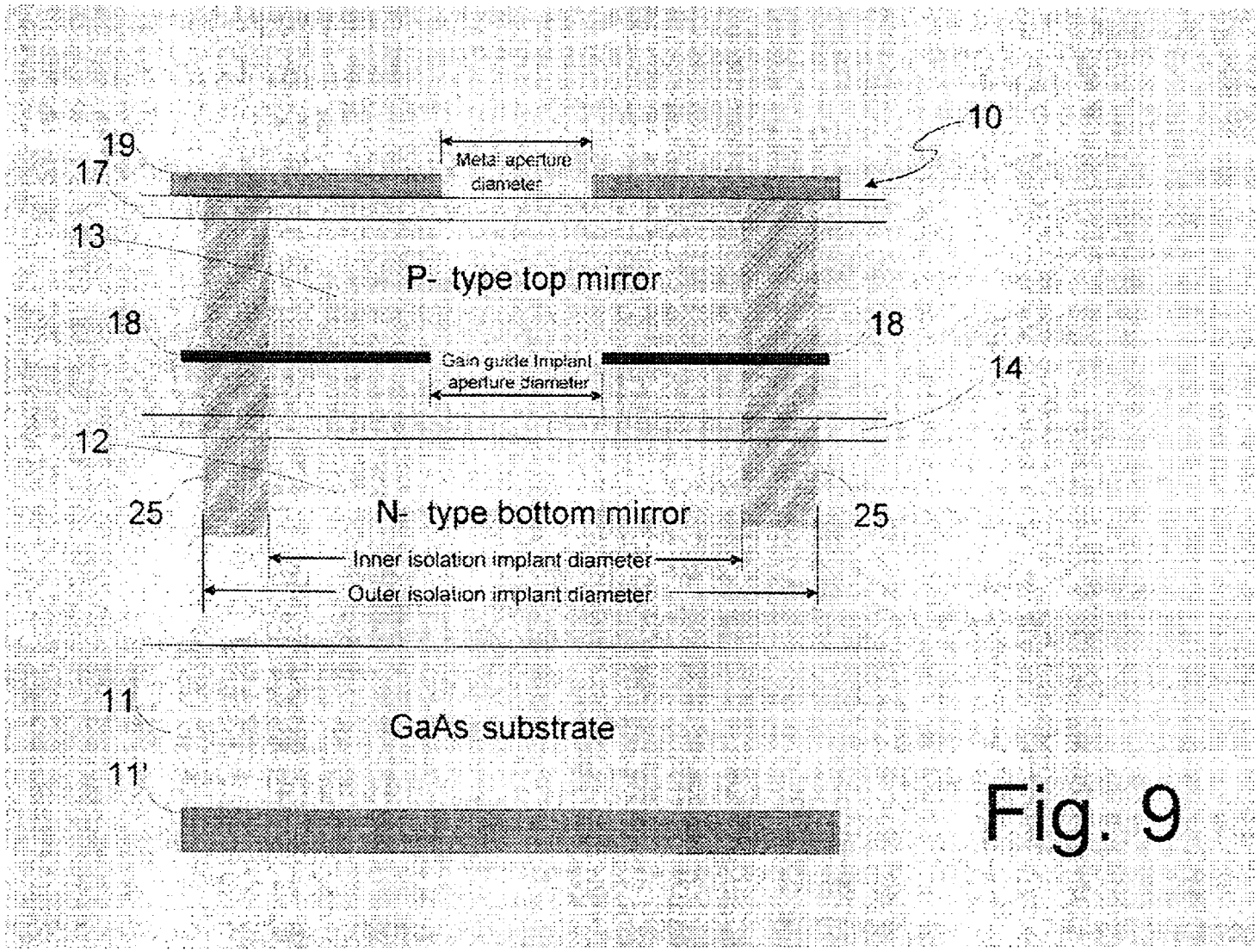
FIG. 9 shows a schematic layer diagram of an alternative red light emission VCSEL embodying the present invention with electrical operation structures.
Figure 10:
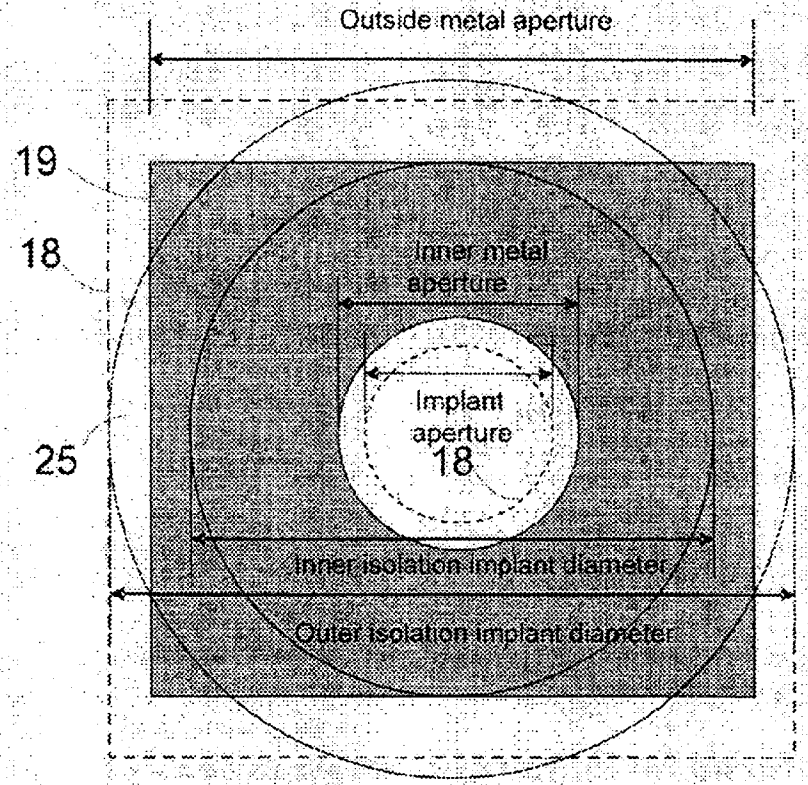
FIG. 10 shows a top view of the red light emission VCSEL device shown in FIG. 9.

In addition to the foregoing epitaxial layers, other structural arrangements are provided in the devices to obtain current confinement and allow electrical contact so as to also improve the performance of the devices. FIGS. 9 and 10 show in a representative device schematic diagram in a partial layer diagram and [atop] *a top* view of a device, respectively, which illustrate such features. Thus, there is shown a red light VCSEL, 10, having a substrate, 11, with a metal interconnection, 11', provided on the exposed outer surface thereof. A n-type conductivity material mirror, 12, is supported on substrate 11 and has between it and a p-type conductivity mirror, 13, an active region, 14, both supported thereon. Mirror 13 has a capping layer, 17, supported thereon with an oxide or implant confining layer, 18, therein, and a metal interconnection, 19, on the side of device 10 opposite that with interconnection 11' with interconnection 19 having therein an emission aperture and being supported on that layer 17.

In FIG. 9, carrier confinement is obtained by providing a gain guide through an ion implantation to form confining layer 18 using protons. Protons are a material species which can penetrate through the rather thick layers of the p-type conductivity mirror and make the material where they come to reside insulating. The protons are implanted with an energy that places the peak of the implantation for layer 18 at a distance of 2 to 6 mirror layer repeatability periods above active region 14 of VCSEL device 10. This carrier confinement structure could alternatively be provided by an oxide aperture through growing a low index mirror layer in the structure with a Al composition therein greater (>0.95) than the composition of the other low index mirror layers (which equals Al0.85), and then using a steam atmosphere at a high temperature to oxidize the high Al containing layer to form an insulating $Al_2O_3$.

However, the implanted structure for layer 18 has several advantages. It allows the use of AlAs in the top mirror which has a higher thermal conductivity than AlGaAs and thus will allow easier heat removal. It generates less stress than does an oxide layer, and hence can result in a more reliable device. It provides a smaller contrast in refractive index, and hence can allow a single mode device to be made at a higher diameter (up to 10 μm) than would be possible with an oxide aperture.

The correct aperture size for the aperture in layer 18 in a single mode device with the gain guide provided by an ion implantation is 6 μm<aperture diameter<μm, with 8 to 10 μm typically the optimum size. A smaller diameter device would be required to achieve a single mode device with an oxide aperture for carrier confinement.

The emission aperture in metal interconnection 19, which allows the light to escape the device for emission, should nominally be the same diameter as the implant aperture ±0.5 μm though shown as of different diameters in FIG. 10. Equal metal and implant aperture diameters typically provide the best combination of output power efficiency and low lateral resistance (i.e. the current does not need to travel a longer lateral distance to reach the aperture.)

FIGS. 9 and 10 also show a device electrical isolation implant structure, 25, to isolate one VCSEL device from its neighboring devices in a multiple device monolithic integrated circuit chip so the injected carriers pass through the intended device rather than traveling to a neighboring device. This implantation is also more likely to be implanted using protons, although it is conceivable that another species, such as oxygen, for instance, could be used if a high implantation energy is available. The inner isolation implant diameter is large enough that it does not interfere with the metal contact to the device, i.e. with an inner diameter aperture which is at least 10 μm larger than the inner diameter of the metal. The outer isolation diameter should be 5 to 40 μm larger than the inner diameter. While it could be "infinite" (a blanket implant everywhere except for the devices) the narrower ring of an implant is expected to provide a thermal advantage, i.e. unimplanted material is a better thermal conductor than the implanted material. The choice of the width of the implanted ring is a balance between the need to provide good isolation between devices, with the desire to maximize the thermal conductivity.

A particular issue in red VCSEL devices is thermal lensing, i.e. the index of refraction is affected by heating in a nonuniform manner. Both the proton implant and the oxide aperture methods for providing electrical and optical energy confinement in VCSELs present limitations. Generally, oxide apertures provide too strong index guiding resulting in multi-mode devices for all but the smallest apertures. While single mode devices can be achieved for small aperture devices, the amount of single mode output power achievable is limited by heating and current density. On the other hand, the weak index guiding provided by the proton implant can allow single mode performance to be achieved at larger diameters, but thermal lensing becomes a problem, with the modal structure varying as a function of temperature. When the device is to be modulated with a very wide bandwidth, the occurrence of thermal lensing can lead to difficulties in achieving modulation with a predictable and stable output power as a function of temperature.

Figure 11:
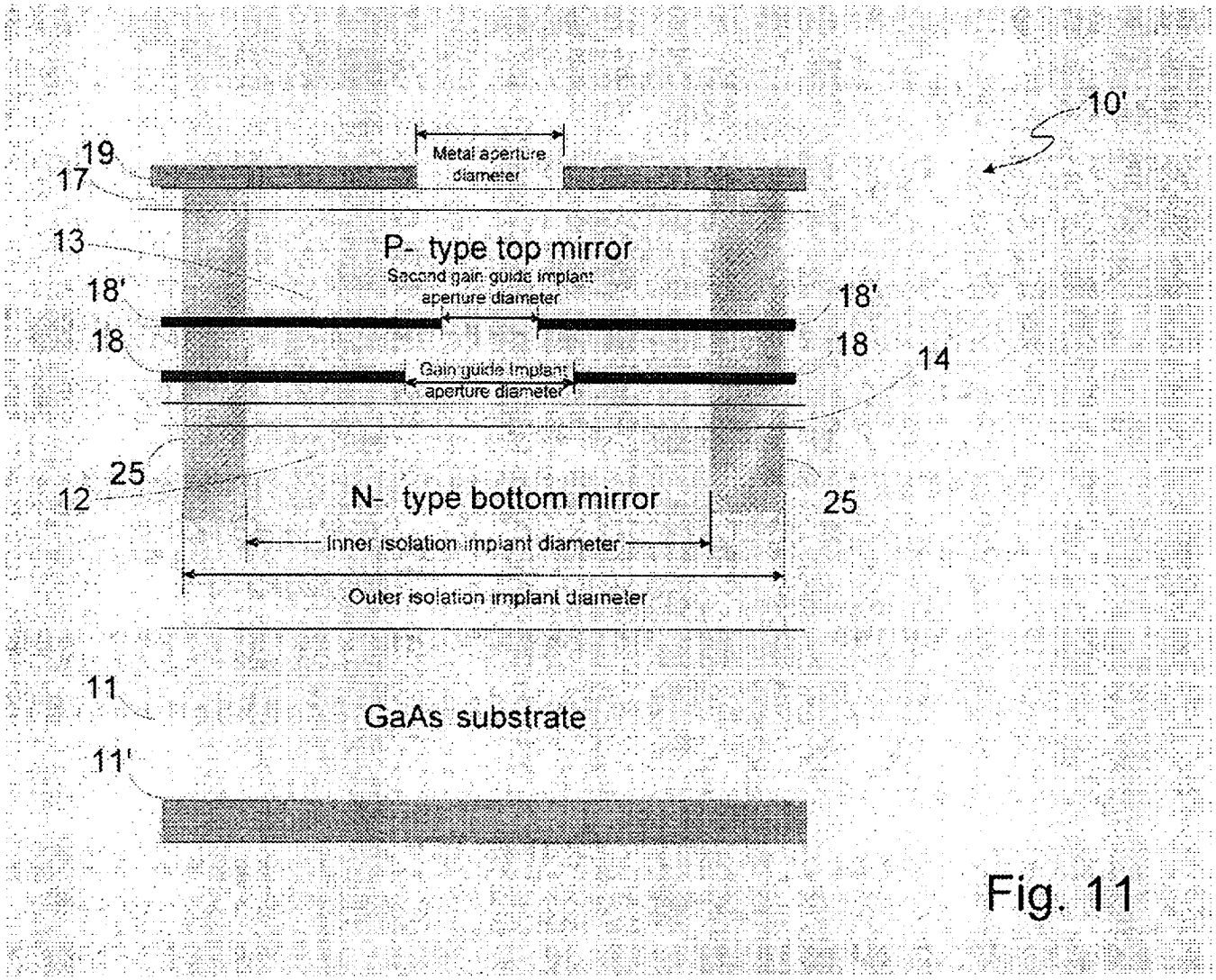
FIG. 11 shows a schematic layer diagram of an alternative red light emission VCSEL embodying the present invention with electrical operation structures.

One alternative red light VCSEL device, 10', for maximizing the ability to achieve high single mode output power while minimizing the thermal lensing is to use a double proton implant, or a graded ion implantation therein as is shown in the representative schematic diagram of FIG. 11. The lower energy implant layer, 18', is shallower, and a mask forming a smaller diameter unimplanted region is used. The second, higher energy implant, to form implant layer 18 is used with a mask that provides a larger diameter unimplanted region. The higher, smaller diameter implant layer 18' helps to guide the current flow to the center of the lower implant aperture, thus helping to counteract the thermal lensing effect that guides current away from the center. However, this approach keeps the current density in the active region consistent with a larger diameter device which is important for achieving a larger single mode output power, and improve device lifetime.

This effect can also be refined by using multiple (>2) implant energies and mask diameters, or possibly by the use of implantation done at an angle to achieve the effect of a smaller diameter implant toward the surface of the device, and a larger diameter implant closer to the active region.

Figure 12:
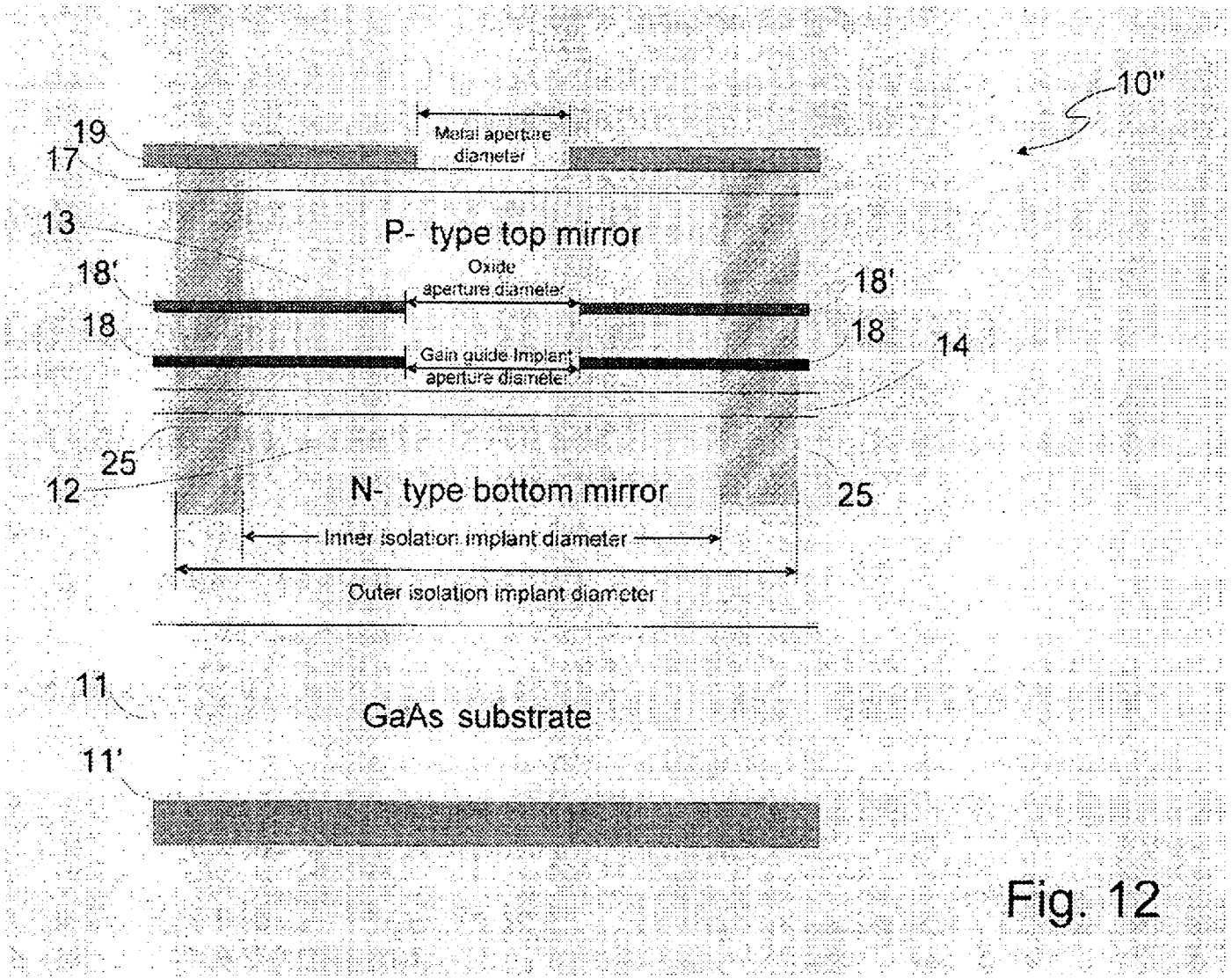
FIG. 12 shows a schematic layer diagram of an alternative red light emission VCSEL embodying the present invention with electrical operation structures.

Yet another alternative, 10", for achieving mode control and a larger diameter single mode in a red light. VCSEL device is shown in the representative schematic diagram of FIG. 12. This uses a combination of an ion implantation aperture and an oxide aperture. The specific implantation is to provide proton implant layer 18 to a depth centered close to quantum well active region 14, i.e. centered anywhere from the quantum well active region to four periods above the quantum wells. In addition, an oxide layer, 18", with an aperture is formed at a position greater than six periods toward interconnection 19 from quantum well active region 14 in order to provide a weak index guide. Basically, oxide layer 18" will provide a weak index confinement for the optical modes, providing greater stability with temperature of the optical modes, while proton implant layer 18 will provide the electrical current confinement.

Figure 13:
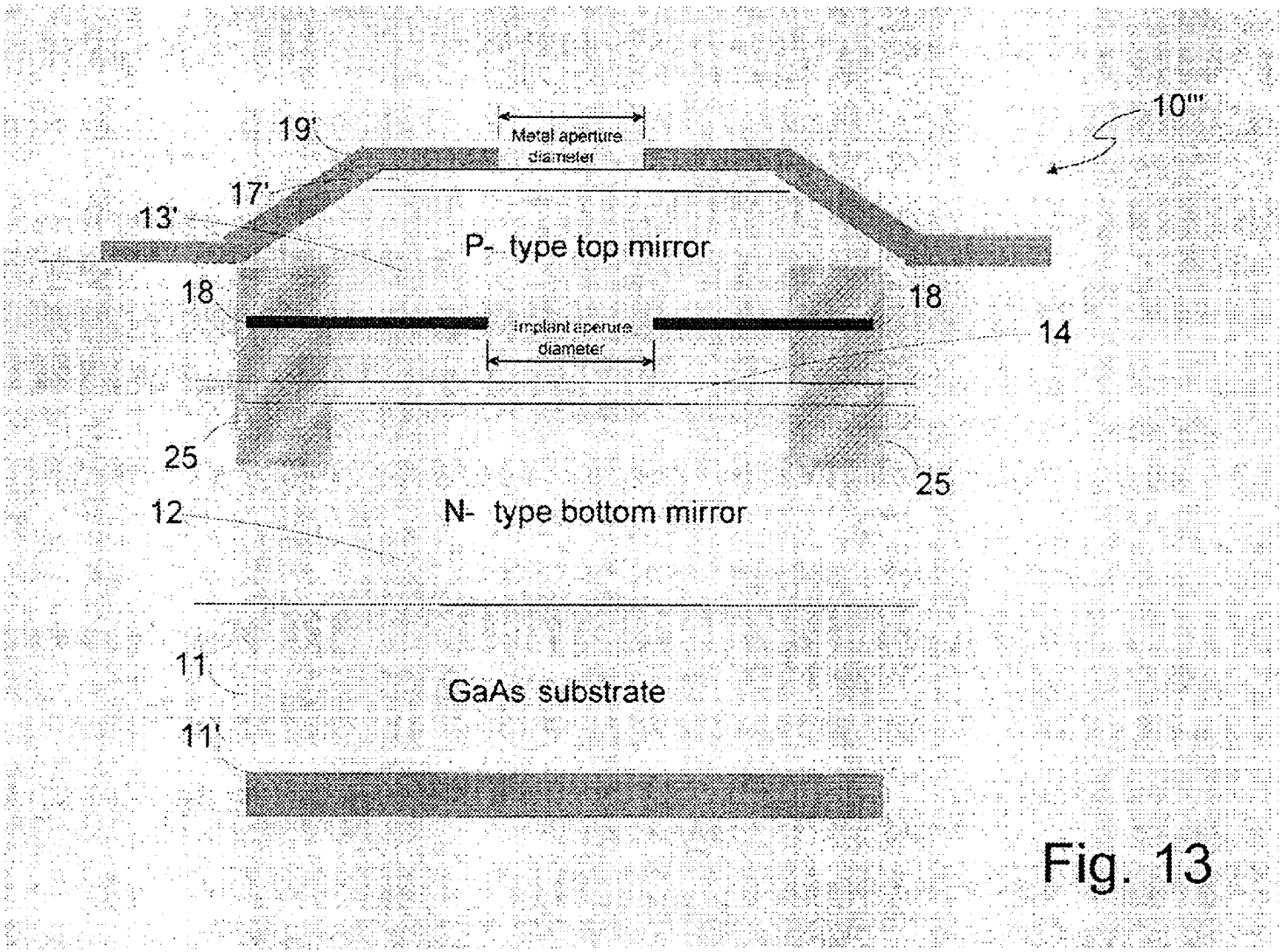
FIG. 13 shows a schematic layer diagram of an alternative red light emission VCSEL embodying the present invention with electrical operation structures.

Another alternative for a red light VCSEL device configuration and its fabrication process is shown in the representative schematic diagram of FIG. 13. In this case, an etch into capping layer 17 and mirror 13 of FIG. 9 is performed, preferably one that leaves a slight positive slope in that resulting mirror, 13' and in resulting capping layer, 17', in a modified VCSEL, 10'", in FIG. 13. The metal for a metal interconnection, 19', with an aperture is then deposited so that it covers this etched sloping sidewall in providing this interconnection. The purpose of this configuration is to further improve the heat removal from the device because the heat generated therein during operation is conducted more effectively in the lateral direction than in the vertical direction in the structure. This arrangement allows the metal to be in contact with the sidewalls and several layers in the structure to more easily remove heat from the device. The ability to use AlAs, which has a higher thermal conductivity than the AlGaAs alloy, in the mirrors winch the proton implant design allows further facilitates this heat removal. As mentioned above, this option is allowed by the use of proton implantation for the gain guide, but is not available to use if the gain guide is an oxide aperture. Furthermore, the arrangement also allows the isolation implant to penetrate deeper into the device, or alternatively, allows for a lower energy implant.

Figure 14:
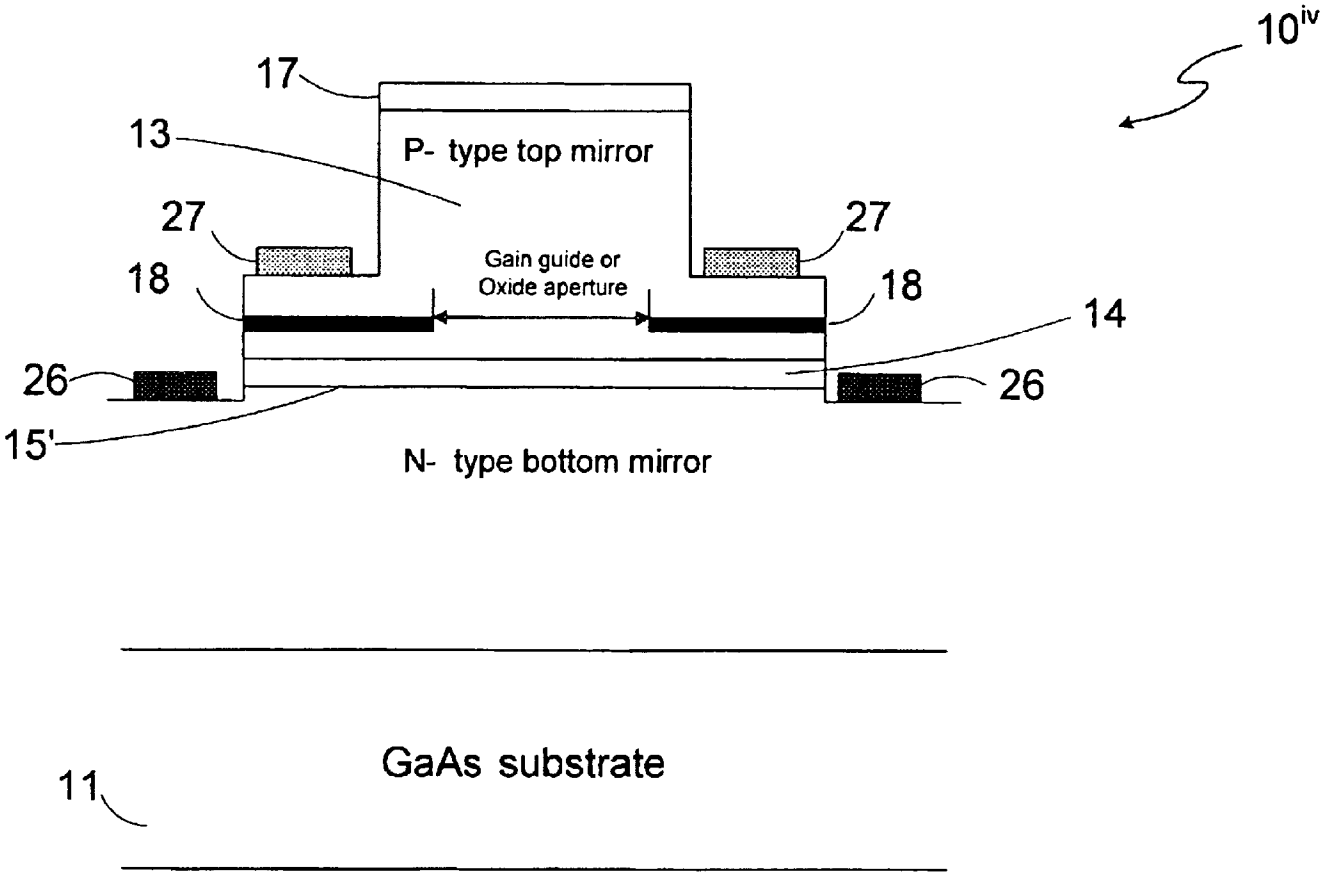
FIG. 14 shows a schematic layer diagram of an alternative red light emission VCSEL embodying the present invention.

Another arrangement, 10'^v, for the electrical contact structure of a red light emission VCSEL is shown in FIG. 14. In this arrangement, metal contacts, 26, suited for ohmic connection to n-type conductivity material make electrical contact to a surface provided parallel to the substrate of a modified n-type conductivity cladding layer 15' in active region 14 at n-type conductivity mirror, 12. Further, metal contacts, 27, suited for ohmic connection to p-type conductivity material make electrical contact to a surface provided parallel to the substrate of a modified p-type conductivity mirror, 13'. Thus, contacts to the pn junction of the VCSEL device are made to a cladding layer and a mirror layer in and near active region 14 within VCSEL device 10'" rather than being formed to the substrate and emission surface of the device. This arrangement requires etching two mesas—one mesa is etched in the portion of p-type conductivity mirror 13 of FIG. 9 near to active region 14 to form modified mirror 13' of FIG. 14 (or alternatively the top of p-type cladding region 16 in active region 14 suitably modified) for contacts 27, while the other mesa is etched in the portion of n-type conductivity cladding layer 15 of FIG. 9 in active region 14 to form modified cladding layer 15' of FIG. 14 (or the portion of the n-type conductivity mirror 12 near active region 14 suitably modified) for contacts 26. The implementation of this approach can be facilitated by using thicker cladding layers (but designed so that the overall cavity has an optical thickness which is an integer number of the emission wavelength), or separate contact layers within the mirrors. Etch stop layers (typically thin layers which are not etched by the same wet or dry chemistry used to etch the rest of the structure) can be used to stop precisely at the desired layer.

This arrangement places the metal interconnection layers, which typically have a high thermal conductivity, as close to the active region as possible to enable the removal of heat generated during device operation. Furthermore, current does not have to be passed through the higher resistance mirror layers thereby minimizing the heat generation during operation due to electrical resistance.

Figure 15:
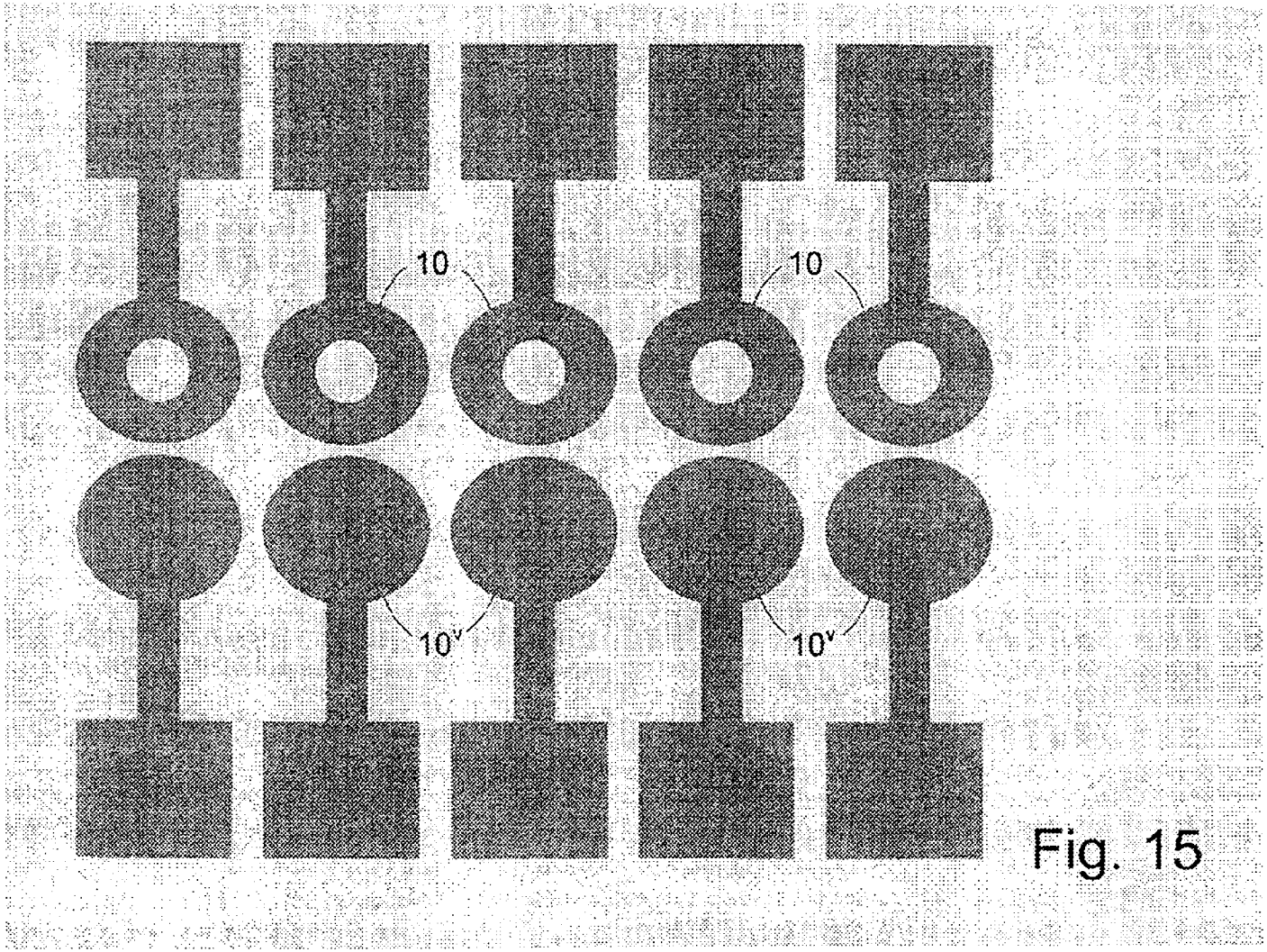
FIG. 15 shows a layout of a monolithic integrated circuit chip with an array of the red light emission VCSEL devices of the present invention.

FIG. 15 shows a representative schematic diagram of a VCSEL array arrangement to maintain a constant thermal load on VCSEL devices to minimize the thermally induced time dependence of their performances. For instance, the output of one VCSEL may decrease, or even increase, as the result of a neighboring device being switched on to emit red light on. The structure of FIG. 14 pairs a VCSEL device 10, as an example, which emits light, with a second device, 10^v, which is identical except that there is no opening in the metal to allow light emission. In use, current would be switched between the light emitting device and the closed device during operation. When one wishes to turn off one of VCSEL devices 10, one switches the current to its closed aperture counterpart. The thermal load on the chip should remain nearly the same. While the figure shows two rows of devices: one row with normal apertures, and the other with closed apertures, a variety of other geometrical arrangements are possible depending upon the intended uses therefor.

Other ways for managing the thermal heat generation and removal include the use of an overcoating on the chip with a polymer or dielectric layer with a high thermal conductivity, such as diamond, or aluminum nitride (AlN). The use of solder to attach the die to the package, rather than conductive epoxy may improve the heat removal through the package. Thinning the substrate to less than 100 μm and attaching the die to a high thermal conductivity submount may improve the heat removal.

Figures 16A, 16B:
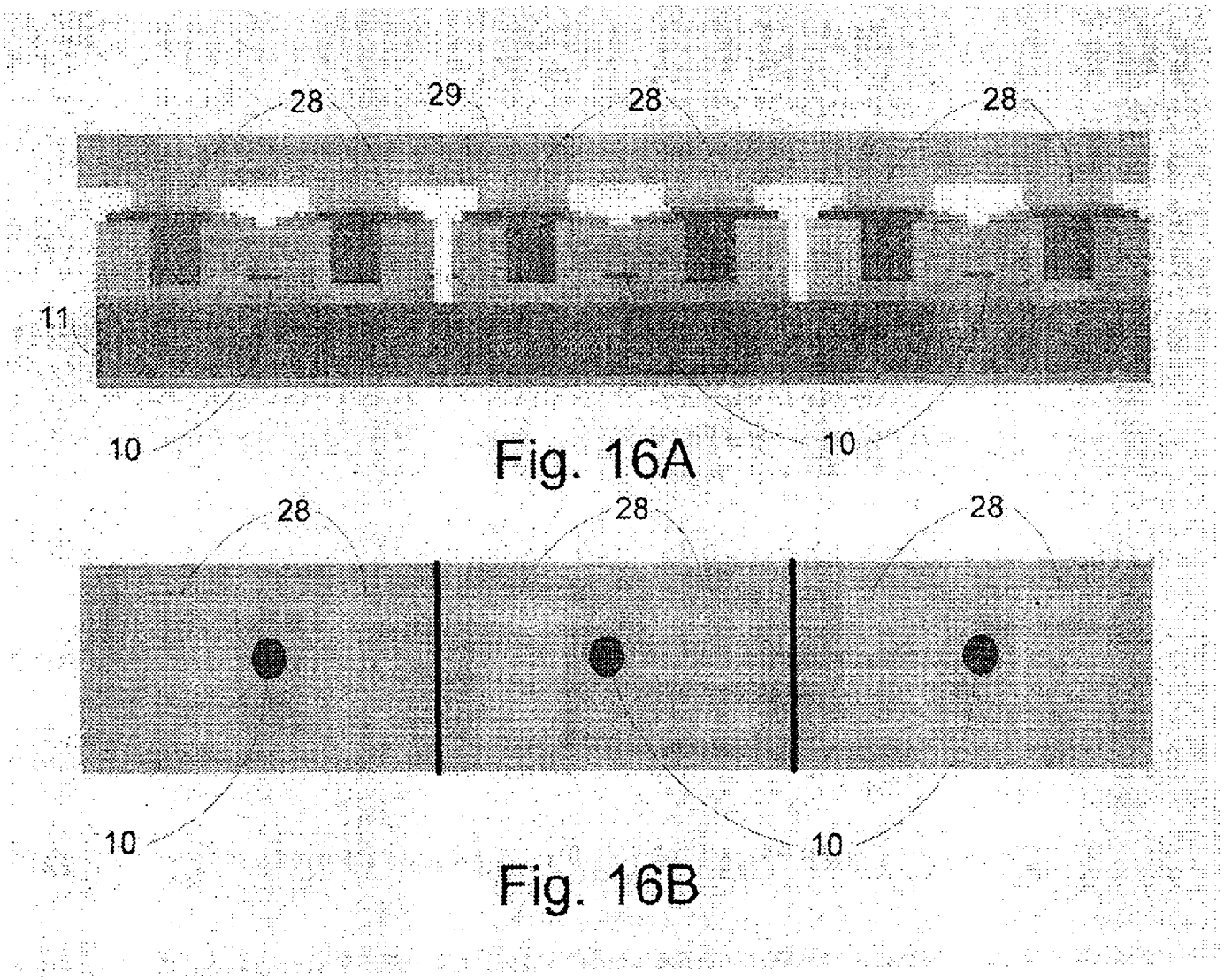
FIG. 16 shows a housing arrangement for an array of the red light emission VCSEL devices of the present invention.

Another arrangement for heat removal is shown in a representative schematic diagram of a VCSEL array packaging configuration in FIG. 16. In this configuration the device bond pads, 28, are plated with thick metal with red light VCSELs 10, for example, positioned between them, and the resulting array device is mounted by solder or stud bumping to a transparent superstrate, 29, preferably one with superior thermal conductance. The proximity of devices 10 to metal lines 28 carrying away the heat is advantageous for those devices.

Alternatively, GaAs substrate 11 could be removed after the device is mounted to superstrate 29, and contacts could be made to the back side of the VCSEL devices. The chip or wafer would then be mounted on a high thermal conductivity submount, which now no longer needs to be transparent. This would also facilitate removal of the heat.

Figure 17:
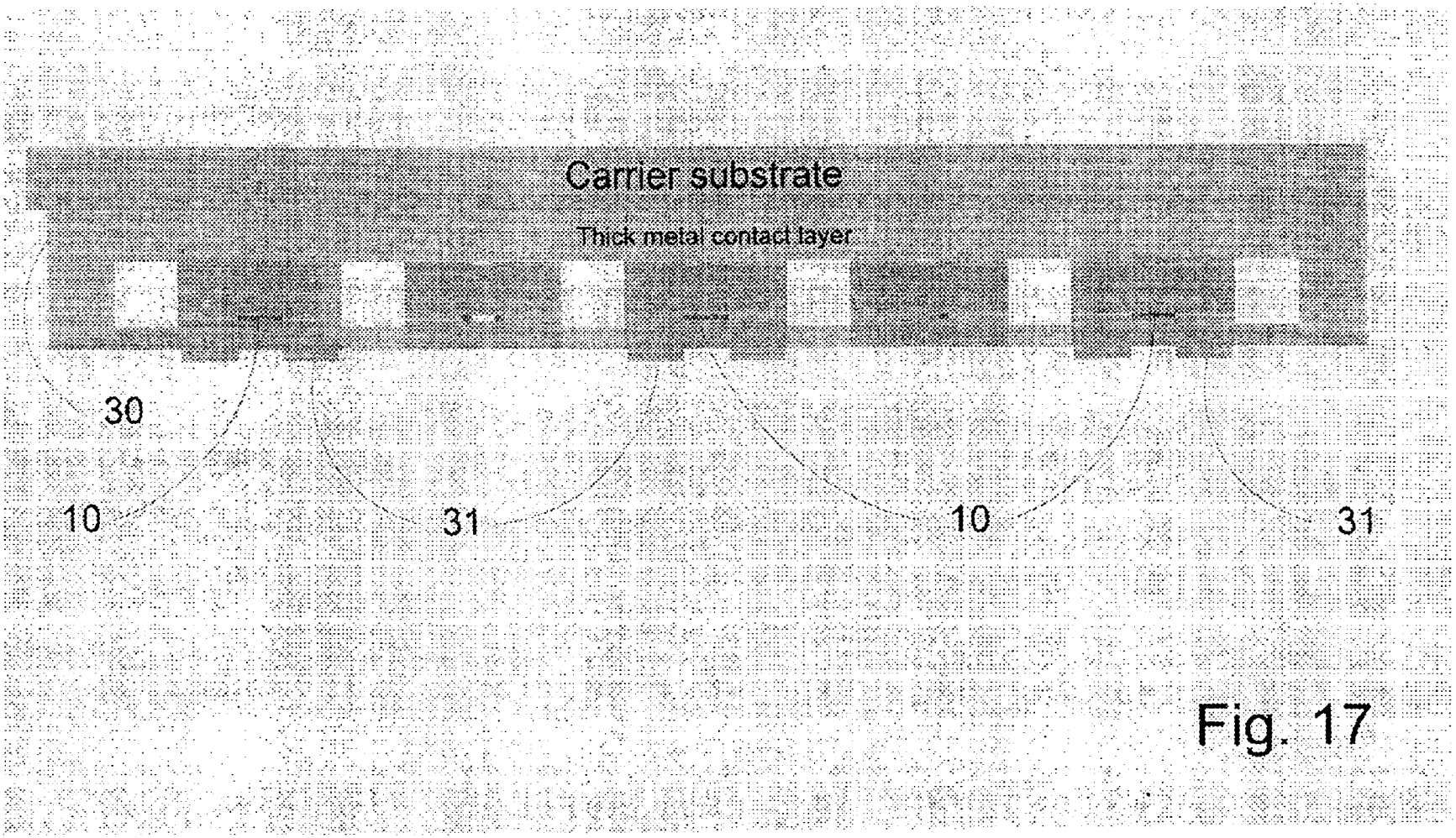
FIG. 17 shows a housing arrangement for an array of the red light emission VCSEL devices of the present invention.

A further representative schematic diagram of a VCSEL array packaging configuration is shown in FIG. 17. In this package, following partial fabrication of the VCSEL structure (the formation of the proton implant or oxide aperture in a VCSEL 10 for example), the wafer with the partially fabricated VCSELs can be attached at an exposed surface of p-type conductivity mirrors 13 therein, for example, to a submount coated with a thick, thermally conductive metal layer, 30. The original GaAs substrate 11 is then removed, and a metal contact, 31, is deposited and patterned on the now exposed surface of the remaining structure originally located next to GaAs substrate 11 (n-type conductivity mirror 12 in this example). This metal contains open apertures allowing the light to escape from the center of each VCSEL. The result also allows for the use of a thick metal layer in close proximity to active region 14 to facilitate heat removal from the device.

Figure 18:
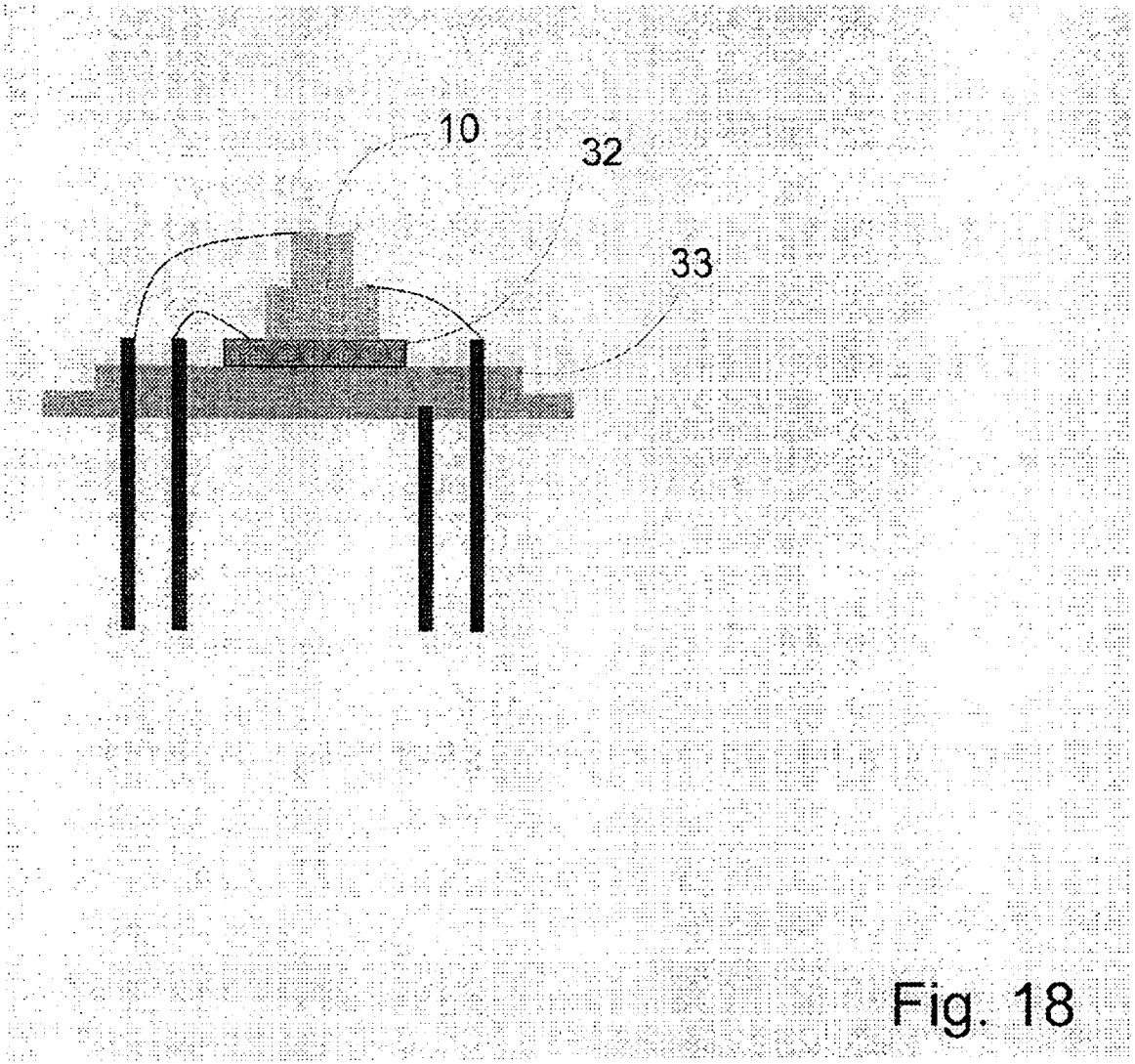
FIG. 18 shows a housing arrangement for a red light emission VCSEL device of the present invention.

A representative schematic diagram of a VCSEL device packaging configuration with active heat removal is shown in FIG. 18. In this package, the VCSEL structure could be any of the configurations already described, or some combination of those configurations. A VCSEL device 10, as an example, is placed directly upon a thermo-electric cooler, 32, to control the temperature of the device during its operation. Thermoelectric coolers are standard microelectronic components for controlling the temperature of circuit or other heat generating operating devices, such as an optoelectronic device or an integrated circuit, and can be purchased in sizes small enough to fit inside a TO header style package, 33. Alternatively, a thermoelectric cooler could be monolithically integrated by first growing a number of GaAs pn junctions for such a cooler on a GaAs substrate, before the growth and processing of the VCSEL structure materials to thereby form VCSEL devices. A stack of around 5 to 20 pn junctions would be grown sequentially one on top of the previous each on the order of 1,000 to 5,000 Å thick as the basis for the cooler. The junctions can be electrically interconnected in parallel through selective etching and metallization interconnection, or electrically interconnected in series through use of intermediate tunnel junctions. Active cooling of VCSEL devices allows keeping them in suitable temperature ranges in which the desired performances can be achieved.

In the devices set out in the foregoing, the key consideration for the mirrors is to reduce the series electrical resistance thereof and the optical absorption therein which in turn results in less heating of the device. This is accomplished by increasing the width of the graded layers in the mirror, reducing the doping levels in the mirror close to the active region, and increasing the doping level in the mirror repeating material layer periods further away from the active region. Reduction of resistance, and therefore heating, is also addressed by heavily doping the layers of the p-type conductivity mirror farthest from the active region to reduce the contact and lateral resistance.

Within the active region, the choices available are made to minimize the impact of heating. The choice of quantum wells with compressive strain, combined with either lattice matched or tensile strained barrier layers, improves the carrier confinement in the active region, thus increasing the temperature range of operation. The use of a more highly p-doped region in the p-type spacer or cladding layer confines electrons to the active region, and prevents them from being injected into the p-type conductivity mirror. Layer composition choices and grading is also done with the objective of improving carrier confinement.

Thermal conductivity must also be improved so that heat can be removed more effectively from the device. The use of the proton implanted structures combined with AlAs containing mirror contributes to that objective. The width of the isolation implant region is limited with the objective of improving thermal conductivity. Etching of the top mirror, and deposition of metal on the etched sidewalls provides a path for heat removal. The deposition of a thermally conductive dielectric, the use of solder in the package, and the packaging structures described for more effectively providing a short thermal path from device to package are all designed to remove heat from the device more quickly and effectively. In general, these enhancements will increase the output power, reduce the threshold current for lasing, reduce the resistance, and increase the temperature range over which the devices successfully operate.

Although the present invention has been described with reference to preferred embodiments, workers skilled in the art will recognize that changes may be made in form and detail without departing from the spirit and scope of the invention.

The invention claimed is:

1. A laser system having a semiconductor material vertical cavity surface emitting laser for emitting narrow linewidth light, said laser comprising:

a compound semiconductor material substrate;

at least two first mirror pairs of semiconductor material layers in a first mirror structure on said substrate of a first conductivity type with each pair member differing from [that] *the* other in at least one constituent concentration and separated from one another by a first mirror member spacer layer with a graded constituent concentration, and each first mirror pair separated from [that] *the* one remaining by a first mirror pair spacer layer with a graded constituent concentration;

an active region on said first mirror structure with plural quantum well structures comprising alternating layers of GaInP and AlGaInP with said quantum well structures being separated from said first mirror structure by at least one active region spacer layer;

at least two second mirror pairs of semiconductor material layers in a second mirror structure on said active region of a second conductivity type with each pair member differing from [that] *the* other in at least one constituent concentration and separated from one another by a second mirror member spacer layer with a graded constituent concentration, and each second mirror pair separated from [that] *the* one remaining by a second mirror pair spacer layer with a graded constituent concentration;

a gain guide layer proton implant based structure having a relatively greater electrical resistivity than said second mirror structure where located at least in part therein so as to surround an aperture region of said second mirror structure across from said active region and to be positioned separated from said active region by at least said two second mirror pairs of semiconductor material layers but less than six such second mirror pairs in said second mirror structure, said aperture region having pairs of side portions thereof each intersected by an axis common thereto that is parallel to said substrate and perpendicular to one other such axis with each said side portions in each said pair separated from one another by 6 μm to 12 μm; and a pair of electrical interconnections to said laser separated from one another by said substrate, said first mirror structure, said active region and said second mirror structure.

2. The laser system of claim 1 wherein said quantum well structures layers of GaInP are under stress in one direction and said quantum well structures layers of AlGaInP are under stress in an opposite direction.

3. The laser system of claim 2 wherein said active region is separated from said first mirror structure by a active region spacer layer having two AlGaInP sublayers therein with that sublayer farthest from said first mirror structure being graduated in aluminum and gallium concentrations over a selected thickness.

4. The laser system of claim 1 wherein said first mirror member spacer layer and said first mirror pair spacer layer each have a thickness [exceeding 15] *of at least 10* nm.

5. The laser system of claim 1 further comprising a spreading layer on said second mirror structure having a thickness equaling an odd number of quarter wavelengths of said narrow linewidth light that said laser can emit.

6. The laser system of claim 1 wherein said two first mirror pairs of semiconductor material layers each have one said semiconductor layer pair member therein formed of AlAs and that remaining one of said semiconductor layer pair members formed therein of AlGaAs with said first mirror member spacer layer and an adjacent said first mirror pair spacer layer together having a thickness equaling a half wavelength of said narrow linewidth light that said laser can emit.

7. The laser system of claim 6 wherein said semiconductor layer pair members of AlAs are each equal in optical thickness to said semiconductor layer pair members of AlGaAs.

8. The laser system of claim 6 wherein said semiconductor layer pair members of AlAs are each optically thicker than said semiconductor layer pair members of AlGaAs.

9. The laser system of claim 1 wherein said first and second mirror structures are of opposite conductivity types.

10. The laser system of claim 1 wherein said first and second mirror structures are both of n-type conductivity and said active region further comprises a pn tunnel junction.

11. The laser system of claim 1 wherein said active region further comprises a zinc doped layer of relatively large conductivity separated from any GaInP layers therein by at least [27] *20* nm.

12. The laser system of claim 1 wherein said active region spacer layer is a first active region spacer layer of n-type conductivity AlGaInP and further comprising *said quantum well structures of* said active region being separated from said second mirror structure by a second active region spacer layer of p-type conductivity AlGaInP.

13. The laser system of claim 1 wherein said active region spacer layer is a first active region spacer layer of n-type conductivity AlAs and further comprising *said quantum well structures of* said active region being separated from said second mirror structure by a second active region spacer layer of p-type conductivity AlAs.

14. The laser system of claim 1 further comprising an isolation enclosing shell region in said laser extending along and surrounding an axis perpendicular to said substrate and surrounding but spaced apart from said aperture region of said second mirror structure in said gain guide layer structure.

15. The laser system of claim 1 wherein that one of said pair of electrical interconnections made to said laser that is closer to said second mirror structure has an aperture opening therein across from said aperture region.

16. The laser system of claim 15 further comprising a transparent mount and wherein that one of said pair of electrical interconnections made to said laser that is closer to said second mirror structure is electrically interconnected to said mount.

17. The laser system of claim 15 further comprising an electrically conductive mount and wherein that one of said pair of electrical interconnections made to said laser that is closer to said second mirror structure is electrically interconnected to said mount, and wherein further said substrate has a metal contact made thereto with an aperture opening therein across said first mirror structure and said active region from said aperture region.

18. The laser system of claim 1 wherein said laser is a first laser and wherein that one of said pair of electrical interconnections made to said first laser that is closer to said second mirror structure thereof has an aperture opening therein across from said aperture region therein, and further comprising a second semiconductor material vertical cavity surface emitting laser on said substrate adjacent to said first laser that is similar to said first laser except for that one of said pair of electrical interconnections made to said second laser that is closer to said second mirror structure thereof is without an aperture opening therein.

19. The laser system of claim 18 further comprising an isolation enclosing shell region in said first laser extending along and surrounding an axis perpendicular to said substrate and surrounding but spaced apart from said aperture region of said second mirror structure in said gain guide layer structure of said first laser and located in part between said first laser and said second laser.

20. The laser of claim 1 wherein said gain guide layer structure is a first gain guide layer structure and said aperture region of said second mirror structure is a first aperture region, and further comprising a second gain guide layer structure formed of an oxide material to have a relatively greater electrical resistivity than said second mirror structure where located at least in part therein and on a side of said first gain guide layer structure opposite that side thereof closer to said active region so as to surround a second aperture region of said second mirror structure across from said first aperture region.

21. The laser of claim 20 wherein that one of said pair of electrical interconnections made to said laser that is closer to said second mirror structure has an aperture opening therein across from said second aperture region.

22. The laser of claim 1 wherein a surface of said first mirror structure parallel to said substrate extends past said active region and has made thereto one said pair of electrical interconnections made to said laser, and wherein a surface of said second mirror structure parallel to said substrate is across from said gain guide layer structure without being across from said aperture region and has made thereto that remaining one said pair of electrical interconnections made to said laser.

23. The laser system of claim 1 wherein said substrate has a thickness less than 100 μm and further comprising said substrate being bonded to a base having a large thermal conductivity.

24. The laser system of claim 23 wherein said base is electrically conductive and serves as one of said pair of electrical interconnections made to said laser.

25. A semiconductor material vertical cavity surface emitting laser for emitting narrow linewidth light, said laser comprising:

a compound semiconductor material substrate;

at least two first mirror pairs of semiconductor material layers in a first mirror structure on said substrate of a first conductivity type with each pair member differing from [that] *the* other in at least one constituent concentration and separated from one another by a first mirror member spacer layer with a graded constituent concentration, and each first mirror pair separated from [that] *the* one remaining by a first mirror pair spacer layer with a graded constituent concentration;

an active region on said first mirror structure with plural quantum well structures comprising alternating layers of GaInP and AlGaInP with said quantum well structures being separated from said first mirror structure by at least one active region spacer layer, said active region further comprising a zinc doped layer of relatively large conductivity separated from any GaInP layers therein by at least [27] *20* nm;

at least two second mirror pairs of semiconductor material layers in a second mirror structure on said active region of a second conductivity type with each pair member differing from [that] *the* other in at least one constituent concentration and separated from one another by a second mirror member spacer layer with a graded constituent concentration, and each second mirror pair separated from [that] *the* one remaining by a second mirror pair spacer layer with a graded constituent concentration;

a gain guide layer structure formed of an oxide material to have a relatively greater electrical resistivity than said second mirror structure where located at least in part therein so as to surround an aperture region of said second mirror structure across from said active region and to be positioned separated from said active region; and a pair of electrical interconnections to said laser separated from one another by said substrate, said first mirror structure, said active region and said second mirror structure.

26. The laser system of claim 25 wherein said quantum well structures layers of GaInP are under stress in one direction and said quantum well structures layers of AlGaInP are under stress in an opposite direction.

27. The laser system of claim 26 wherein said active region is separated from said first mirror structure by a active region spacer layer having two AlGaInP sublayers therein with that sublayer farthest from said first mirror structure being graduated in aluminum and gallium concentrations over a selected thickness.

28. The laser system of claim 25 wherein said first mirror member spacer layer and said first mirror pair spacer layer each have a thickness [exceeding 15] *of at least 10* nm.

29. The laser system of claim 25 further comprising a spreading layer on said second mirror structure having a thickness equaling an odd number of quarter wavelengths of said narrow linewidth light that said laser can emit.

30. The laser system of claim 25 wherein said first and second mirror structures are of opposite conductivity types.

31. The laser system of claim 25 wherein said first and second mirror structures are both of n-type conductivity and said active region further comprises a pn tunnel junction.

32. The laser system of claim 25 wherein said active region spacer layer is a first active region spacer layer of n-type conductivity AlGaInP and further comprising *said quantum well structures of* said active region being separated from said second mirror structure by a second active region spacer layer of p-type conductivity AlGaInP.

33. The laser system of claim 25 wherein said active region spacer layer is a first active region spacer layer of n-type conductivity AlAs and further comprising *said quantum well structures of* said active region being separated from said second mirror structure by a second active region spacer layer of p-type conductivity AlAs.

34. The laser system of claim 25 further comprising an isolation enclosing shell region in said laser extending along and surrounding an axis perpendicular to said substrate and surrounding but spaced apart from said aperture region of said second mirror structure in said gain guide layer structure.

35. The laser system of claim 25 wherein that one of said pair of electrical interconnections made to said laser that is closer to said second mirror structure has an aperture opening therein across from said aperture region.

36. The laser system of claim 35 further comprising a transparent mount and wherein that one of said pair of electrical interconnections made to said laser that is closer to said second mirror structure is electrically interconnected to said mount.

37. The laser system of claim 35 further comprising an electrically conductive mount and wherein that one of said pair of electrical interconnections made to said laser that is closer to said second mirror structure is electrically interconnected to said mount, and wherein further said substrate has a metal contact made thereto with an aperture opening therein across said first mirror structure and said active region from said aperture region.

38. The laser system of claim 25 wherein said laser is a first laser and wherein that one of said pair of electrical interconnections made to said first laser that is closer to said second mirror structure thereof has an aperture opening therein across from said aperture region therein, and further comprising a second semiconductor material vertical cavity surface emitting laser on said substrate adjacent to said first laser that is similar to said first laser except for that one of said pair of electrical interconnections made to said second laser that is closer to said second mirror structure thereof is without an aperture opening therein.

39. The laser system of claim 38 further comprising an isolation enclosing shell region in said first laser extending along and surrounding an axis perpendicular to said substrate and surrounding but spaced apart from said aperture region of said second mirror structure in said gain guide layer structure of said first laser and located in part between said first laser and said second laser.

40. The laser of claim 25 wherein a surface of said first mirror structure parallel to said substrate extends past said active region and has made thereto one said pair of electrical interconnections made to said laser, and wherein a surface of said second mirror structure parallel to said substrate is across from said gain guide layer structure without being across from said aperture region and has made thereto that remaining one said pair of electrical interconnections made to said laser.

41. The laser system of claim 25 wherein said substrate has a thickness less than 100 μm and further comprising said substrate being bonded to a base having a large thermal conductivity.

42. The laser system of claim 41 wherein said base is electrically conductive and serves as one of said pair of electrical interconnections made to said laser.

43. A semiconductor material vertical cavity surface emitting laser for emitting narrow linewidth light, said laser comprising:

a compound semiconductor material substrate;

at least two first mirror pairs of semiconductor material layers in a first mirror structure on said substrate of a first conductivity type with each pair member differing from [that] *the* other in at least one constituent concentration and separated from one another by a first mirror member spacer layer with a graded constituent concentration, and each first mirror pair separated from [that] *the* one remaining by a first mirror pair spacer layer with a graded constituent concentration, said first mirror member spacer layer and said first mirror pair spacer layer each having a thickness [exceeding 15] *of at least 10* nm;

an active region on said first mirror structure with plural quantum well structures comprising alternating layers of GaInP and AlGaInP with said quantum well structures separated from said first mirror structure by at least one active region spacer layer;

at least two second mirror pairs of semiconductor material layers in a second mirror structure on said active region of a second conductivity type with each pair member differing from [that] *the* other in at least one constituent concentration and separated from one another by a second mirror member spacer layer with a graded constituent concentration, and each second mirror pair separated from [that] *the* one remaining by a second mirror pair spacer layer with a graded constituent concentration, said second mirror member spacer layer and said second mirror pair spacer layer each having a thickness [exceeding 15] *of at least 10* nm;

a gain guide layer structure formed of an oxide material to have a relatively greater electrical resistivity than said second mirror structure where located at least in part therein so as to surround an aperture region of said second mirror structure across from said active region and to be positioned separated from said active region; and a pair of electrical interconnections to said laser separated from one another by said substrate, said first mirror structure, said active region and said second mirror structure.

44. The laser system of claim 43 wherein said quantum well structures layers of GaInP are under stress in one direction and said quantum well structures layers of AlGaInP are under stress in an opposite direction.

45. The laser system of claim 44 wherein said active region is separated from said first mirror structure by a active region spacer layer having two AlGaInP sub layers therein with that sublayer farthest from said first mirror structure being graduated in aluminum and gallium concentrations over a selected thickness.

46. The laser system of claim 43 further comprising a spreading layer on said second mirror structure having a thickness equaling an odd number of quarter wavelengths of said narrow linewidth light that said laser can emit.

47. The laser system of claim 43 wherein said first and second mirror structures are of opposite conductivity types.

48. The laser system of claim 43 wherein said first and second mirror structures are both of n-type conductivity and said active region further comprises a pn tunnel junction.

49. The laser system of claim 43 wherein said active region spacer layer is a first active region spacer layer of n-type conductivity AlGaInP and further comprising *said quantum well structures of* said active region being separated from said second mirror structure by a second active region spacer layer of p-type conductivity AlGaInP.

50. The laser system of claim 43 wherein said active region spacer layer is a first active region spacer layer of n-type conductivity AlAs and further comprising *said quantum well structures of* said active region being separated from said second mirror structure by a second active region spacer layer of p-type conductivity AlAs.

51. The laser system of claim 43 further comprising an isolation enclosing shell region in said laser extending along and surrounding an axis perpendicular to said substrate and surrounding but spaced apart from said aperture region of said second mirror structure in said gain guide layer structure.

52. The laser system of claim 43 wherein that one of said pair of electrical interconnections made to said laser that is closer to said second mirror structure has an aperture opening therein across from said aperture region.

53. The laser system of claim 52 further comprising a transparent mount and wherein that one of said pair of electrical interconnections made to said laser that is closer to said second mirror structure is electrically interconnected to said mount.

54. The laser system of claim 52 further comprising an electrically conductive mount and wherein that one of said pair of electrical interconnections made to said laser that is closer to said second mirror structure is electrically interconnected to said mount, and wherein further said substrate has a metal contact made thereto with an aperture opening therein across said first mirror structure and said active region from said aperture region.

55. The laser system of claim 43 wherein said laser is a first laser and wherein that one of said pair of electrical interconnections made to said first laser that is closer to said second mirror structure thereof has an aperture opening therein across from said aperture region therein, and further comprising a second semiconductor material vertical cavity surface emitting laser on said substrate adjacent to said first laser that is similar to said first laser except for that one of said pair of electrical interconnections made to said second laser that is closer to said second mirror structure thereof is without an aperture opening therein.

56. The laser system of claim 55 further comprising an isolation enclosing shell region in said first laser extending along and surrounding an axis perpendicular to said substrate and surrounding but spaced apart from said aperture region of said second mirror structure in said gain guide layer structure of said first laser and located in part between said first laser and said second laser.

57. The laser of claim 43 wherein a surface of said first mirror structure parallel to said substrate extends past said active region and has made thereto one said pair of electrical interconnections made to said laser, and wherein a surface of said second mirror structure parallel to said substrate is across from said gain guide layer structure without being across from said aperture region and has made thereto that remaining one said pair of electrical interconnections made to said laser.

58. The laser system of claim 43 wherein said substrate has a thickness less than 100 μm and further comprising said substrate being bonded to a base having a large thermal conductivity.

59. The laser system of claim 58 wherein said base is electrically conductive and serves as one of said pair of electrical interconnections made to said laser.

*60. The laser system of claim 13 wherein a high thermal conductivity layer is provided adjacent to at least one of said first and second active region spacer layers.*

*61. The laser system of claim 25 wherein said two first mirror pairs of semiconductor material layers each have one said semiconductor layer pair member therein formed of AlAs and that remaining one of said semiconductor layer pair members formed therein of AlGaAs with said first mirror member spacer layer and an adjacent said first mirror pair spacer layer together having a thickness equaling a half wavelength of said narrow linewidth light that said laser can emit.*

*62. The laser system of claim 61 wherein said semiconductor layer pair members of AlAs are each equal in optical thickness to said semiconductor layer pair members of AlGaAs.*

*63. The laser system of claim 61 wherein said semiconductor layer pair members of AlAs are each optically thicker than said semiconductor layer pair members of AlGaAs.*

*64. The laser system of claim 25 wherein said second mirror structure has at least six second mirror pairs of semiconductor material layers including, and structured like, said two second mirror pairs of semiconductor material layers, and said gain guide layer is positioned separated from said active region by said six second mirror pairs of semiconductor material layers.*

*65. The laser system of claim 33 wherein sides of said first and second active region spacer layers positioned farthest from said quantum well structures are separated from one another by a distance equal to one wavelength of said narrow linewidth light that said laser can emit.*

*66. The laser system of claim 33 wherein sides of said first and second active region spacer layers positioned farthest from said quantum well structures are separated from one another by a distance equal to an integer multiple of one-half of one wavelength of said narrow linewidth light that said laser can emit.*

*67. The laser system of claim 33 wherein a high thermal conductivity layer is provided adjacent to at least one of said first and second active region spacer layers.*

*68. The laser system of claim 43 wherein said two first mirror pairs of semiconductor material layers each have one said semiconductor layer pair member therein formed of AlAs and that remaining one of said semiconductor layer pair members formed therein of AlGaAs with said first mirror member spacer layer and an adjacent said first mirror pair spacer layer together having a thickness equaling a half wavelength of said narrow linewidth light that said laser can emit.*

*69. The laser system of claim 68 wherein said semiconductor layer pair members of AlAs are each equal in optical thickness to said semiconductor layer pair members of AlGaAs.*

*70. The laser system of claim 68 wherein said semiconductor layer pair members of AlAs are each optically thicker than said semiconductor layer pair members of AlGaAs.*

*71. The laser system of claim 43 wherein said second mirror structure has at least six second mirror pairs of semiconductor material layers including, and structured like, said two second mirror pairs of semiconductor material layers, and said gain guide layer is positioned separated from said active region by said six second mirror pairs of semiconductor material layers.*

*72. The laser system of claim 50 wherein sides of said first and second active region spacer layers positioned farthest from said quantum well structures are separated from one another by a distance equal to one wavelength of said narrow linewidth light that said laser can emit.*

*73. The laser system of claim 50 wherein sides of said first and second active region spacer layers positioned farthest from said quantum well structures are separated from one another by a distance about equal to an integer multiple of one-half of one wavelength of said narrow linewidth light that said laser can emit.*

*74. The laser system of claim 50 wherein a high thermal conductivity layer is provided adjacent to at least one of said first and second active region spacer layers.*

* * * * *